(12) United States Patent
Seo et al.

(10) Patent No.: US 8,937,429 B2
(45) Date of Patent: Jan. 20, 2015

(54) DISPLAY DEVICE AND METHOD FOR MANUFACTURING THEREOF

(71) Applicant: Semiconductor Energy Laboratory Co., Ltd., Kanagawa-ken (JP)

(72) Inventors: Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/295,769

(22) Filed: Jun. 4, 2014

(65) Prior Publication Data

US 2014/0284586 A1 Sep. 25, 2014

Related U.S. Application Data

(63) Continuation of application No. 13/900,798, filed on May 23, 2013, now Pat. No. 8,747,178, which is a continuation of application No. 13/209,717, filed on Aug. 15, 2011, now Pat. No. 8,450,925, which is a (Continued)

(30) Foreign Application Priority Data

Jan. 25, 2002 (JP) .................................. 2002-016524
Feb. 25, 2002 (JP) .................................. 2002-047379
Aug. 30, 2002 (JP) .................................. 2002-255216

(51) Int. Cl.
*H01J 1/62* (2006.01)
*H01L 51/52* (2006.01)
*H01L 27/32* (2006.01)

(52) U.S. Cl.
CPC ............ *H01L 51/5203* (2013.01); *H01L 27/32* (2013.01)

USPC .......................................... 313/504; 313/506

(58) Field of Classification Search
USPC .......................... 313/498, 504, 506, 509, 512
See application file for complete search history.

(56) References Cited

U.S. PATENT DOCUMENTS 5,742,129 A 4/1998 Nagayama et al.
5,834,893 A 11/1998 Bulovic et al.
(Continued)

FOREIGN PATENT DOCUMENTS

EP 0 954 205 A2 11/1999
EP 0 961 525 A1 12/1999
(Continued)

OTHER PUBLICATIONS

Tang, C.W. et al., "Organic Electroluminescent Diodes," Applied Physics Letters, Sep. 21, 1987, vol. 51, No. 12, pp. 913-915.

(Continued)

*Primary Examiner* — Joseph L Williams
(74) *Attorney, Agent, or Firm* — Husch Blackwell LLP

(57) ABSTRACT

It is a problem to provide an electric apparatus less in consumption power and long in life by the manufacture using the display device. An insulating bank is provided in a form surrounding the pixel portions on first electrodes over a substrate. The entire surface is applied, by a wet scheme (method), with an organic conductive film which has a thickness form of T2>T1>T3 under the influence of the insulating bank. Accordingly, the portion T3 has an increased resistance in a lateral direction, making possible to prevent against crosstalk. Due to a conductive polymer as a buffer layer, a display device can be provided which is low in drive voltage. Furthermore, because the portion T2 is increased in thickness, the electric-field concentration is relaxed at and around the pixel portion. This makes it possible to prevent the organic light-emitting element from deteriorating at around the pixel.

18 Claims, 13 Drawing Sheets

Related U.S. Application Data continuation of application No. 12/790,238, filed on May 28, 2010, now Pat. No. 8,004,183, which is a continuation of application No. 11/713,910, filed on Mar. 5, 2007, now Pat. No. 7,728,513, which is a continuation of application No. 10/345,745, filed on Jan. 16, 2003, now Pat. No. 7,199,516.

(56) References Cited

U.S. PATENT DOCUMENTS

| | | |
|---|---|---|
| 5,955,244 A | 9/1999 | Duval |
| 6,246,179 B1 | 6/2001 | Yamada |
| 6,274,887 B1 | 8/2001 | Yamazaki et al. |
| 6,297,589 B1 | 10/2001 | Miyaguchi et al. |
| 6,306,559 B1 | 10/2001 | Tanamura et al. |
| 6,359,606 B1 | 3/2002 | Yudasaka |
| 6,486,601 B1 | 11/2002 | Sakai et al. |
| 6,583,584 B2 | 6/2003 | Duineveld et al. |
| 6,597,121 B2 | 7/2003 | Imura |
| 6,621,217 B2 | 9/2003 | Nishiki et al. |
| 6,734,839 B2 | 5/2004 | Yudasaka |
| 6,762,552 B1 | 7/2004 | Duineveld et al. |
| 6,768,257 B1 | 7/2004 | Yamada et al. |
| 6,805,979 B2 | 10/2004 | Ogura et al. |
| 6,853,130 B2 | 2/2005 | Morii |
| 6,866,807 B2 | 3/2005 | Comb et al. |
| 6,869,635 B2 | 3/2005 | Kobayashi |
| 6,905,784 B2 | 6/2005 | Seo |
| 6,936,846 B2 | 8/2005 | Koyama et al. |
| 6,991,506 B2 | 1/2006 | Yamada et al. |
| 7,102,280 B1 | 9/2006 | Duineveld et al. |
| 7,138,762 B2 | 11/2006 | Morii |
| 7,142,781 B2 | 11/2006 | Koyama et al. |
| 7,199,516 B2 | 4/2007 | Seo et al. |
| 7,300,686 B2 | 11/2007 | Morii et al. |
| 7,427,832 B2 | 9/2008 | Kobayashi |
| 7,488,506 B2 | 2/2009 | Morii et al. |
| 7,728,513 B2 | 6/2010 | Seo et al. |
| 7,898,170 B2 | 3/2011 | Kobayashi |
| 2001/0011868 A1 | 8/2001 | Fukunaga et al. |
| 2001/0041270 A1 | 11/2001 | Maruyama et al. |
| 2002/0089497 A1 | 7/2002 | Yudasaka |
| 2002/0113546 A1 | 8/2002 | Seo et al. |
| 2002/0153831 A1 | 10/2002 | Sakakura et al. |
| 2003/0015960 A1 | 1/2003 | Seo et al. |
| 2003/0020088 A1 | 1/2003 | Seo et al. |
| 2003/0146693 A1 | 8/2003 | Ishihara et al. |
| 2003/0196597 A1 | 10/2003 | Yamazaki et al. |
| 2003/0218419 A1 | 11/2003 | Bae |
| 2004/0065902 A1 | 4/2004 | Yamazaki et al. |
| 2005/0161672 A1 | 7/2005 | Yamazaki et al. |

FOREIGN PATENT DOCUMENTS

| | | |
|---|---|---|
| EP | 1 003 354 A1 | 5/2000 |
| EP | 1 009 198 A1 | 6/2000 |
| EP | 1 096 568 A2 | 5/2001 |
| EP | 1 122 800 A2 | 8/2001 |
| EP | 1 148 553 A2 | 10/2001 |
| EP | 1 191 823 A1 | 3/2002 |
| EP | 1 624 485 A2 | 2/2006 |
| JP | 03-250583 A | 11/1991 |
| JP | 03-269995 A | 12/1991 |
| JP | 08-199161 A | 8/1996 |
| JP | 08-227276 A | 9/1996 |
| JP | 09-007768 A | 1/1997 |
| JP | 10-012377 A | 1/1998 |
| JP | 10-077467 A | 3/1998 |
| JP | 10-172765 A | 6/1998 |
| JP | 11-260549 A | 9/1999 |
| JP | 11-273859 A | 10/1999 |
| JP | 11-307270 A | 11/1999 |
| JP | 2000-003789 A | 1/2000 |
| JP | 2001-217075 A | 8/2001 |
| JP | 2001-338771 A | 12/2001 |
| JP | 2001-351787 A | 12/2001 |
| JP | 2002-006777 A | 1/2002 |
| JP | 2002-132186 A | 5/2002 |
| JP | 2002-231447 A | 8/2002 |
| JP | 2002-299058 A | 10/2002 |
| JP | 2003-123988 A | 4/2003 |
| KR | 2000-0068846 A | 11/2000 |
| KR | 2001-0051318 A | 6/2001 |
| WO | WO 98/08143 A1 | 2/1998 |
| WO | WO 99/12398 A1 | 3/1999 |
| WO | WO 00/01203 A1 | 1/2000 |
| WO | WO 01/41229 A1 | 6/2001 |
| WO | WO 01/63975 | 8/2001 |

OTHER PUBLICATIONS

Adachi, C. et al., "Electroluminescence in Organic Films with Three-Layer Structure," Japanese Journal of Applied Physics, Feb. 20, 1988, vol. 27, No. 2, pp. L269-L271.

Wakimoto, T. et al., "Organic EL Cells Using Alkaline Metal Compounds as Electron Injection Materials," IEEE Transactions on Electron Devices, Aug. 1, 1997, vol. 44, No. 8, pp. 1245-1248.

Yamamori, A. et al., "Doped Organic Light Emitting Diodes Having a 650-NM-Thick Hole Transport Layer," Applied Physics Letters, Apr. 27, 1998, vol. 72, No. 17, pp. 2147-2149.

Sato, Y. et al., "Interface and Material Considerations of OLEDs", Proceedings of SPIE—Organic Light-Emitting Materials and Devices III, Jul. 1, 1999, vol. 3797, pp. 198-208.

Sato, Y., "Anode Buffer Layer Comprising Polymer," Molecular Electronics and Bioelectronics, 2000, vol. 11, No. 1, pp. 86-99.

Elschner, A. et al., "High-Resistivity PEDT/PSS for Reduced Crosstalk in Passive Matrix OELS", Asia Display / IDW '01, 2001, pp. 1427-1430.

Pretrial Report re Japanese Application No. JP 2003-014399, dated Nov. 10, 2006.

Korean Office Action re Application No. KR 10-2003-0004881, dated Oct. 20, 2009.

European Search Report re Application No. EP 03001028.4, dated Apr. 15, 2011.

Korean Office Action re Application No. KR 2011-0075957, dated Oct. 28, 2011.

European Office Action re Application No. EP 03001028.4, dated Apr. 23, 2012.

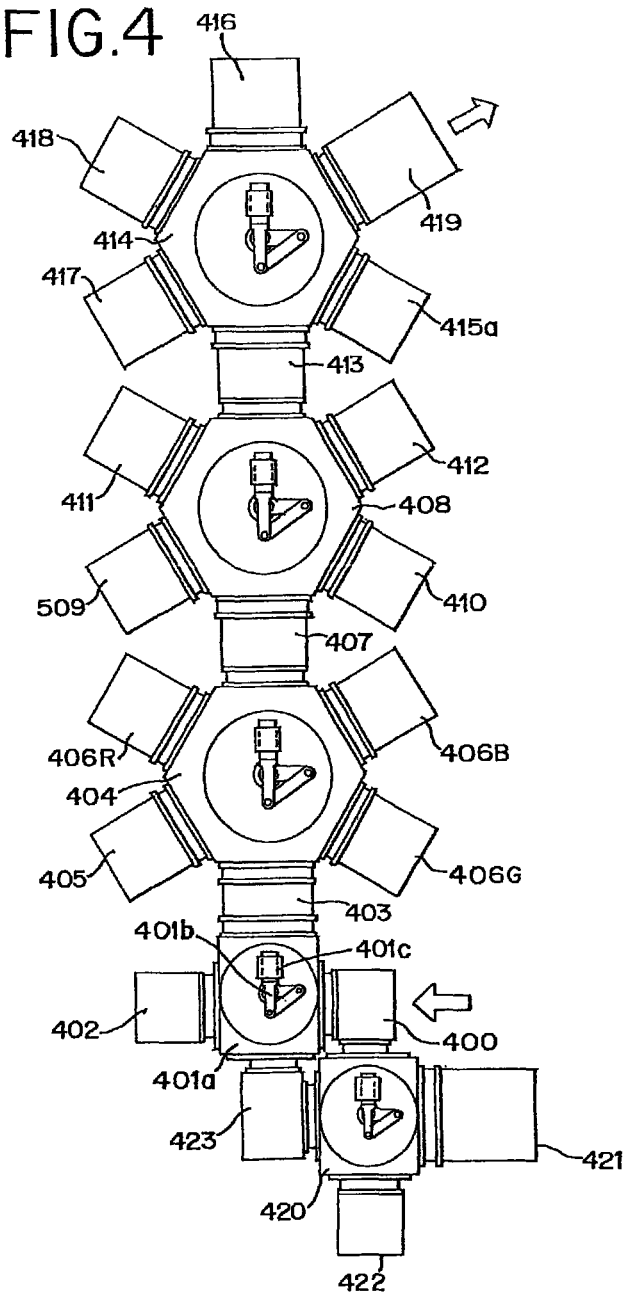

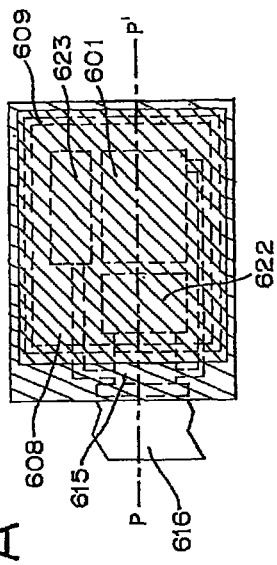
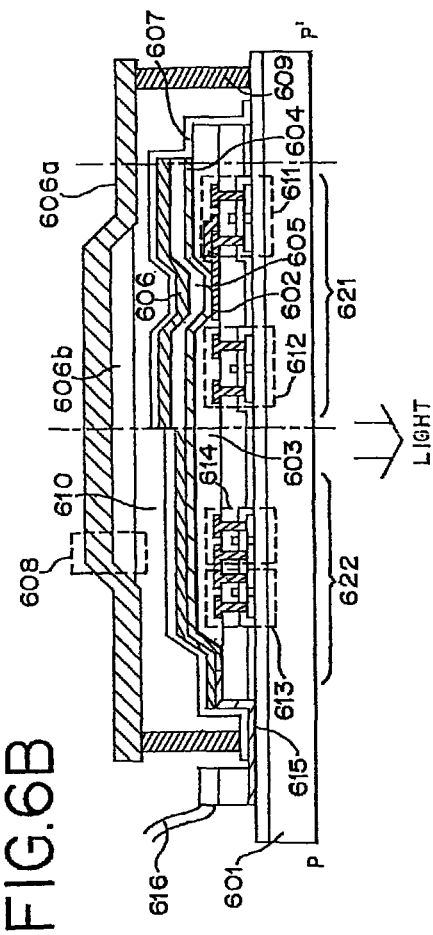
FIG.6A
FIG.6B

SF1–SF6: FRAME, $T_A$: WRITING TIME

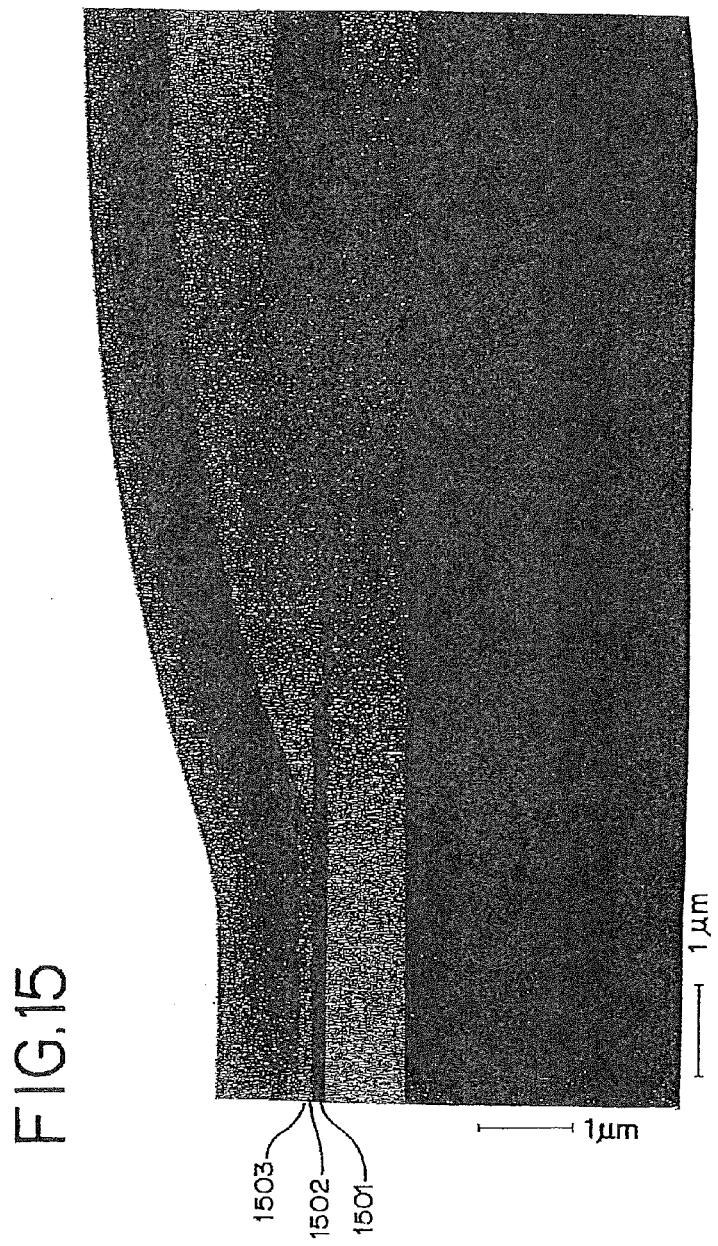

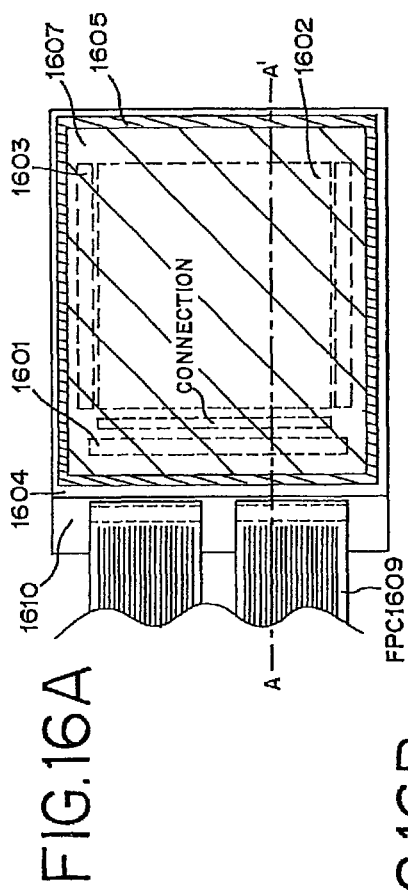
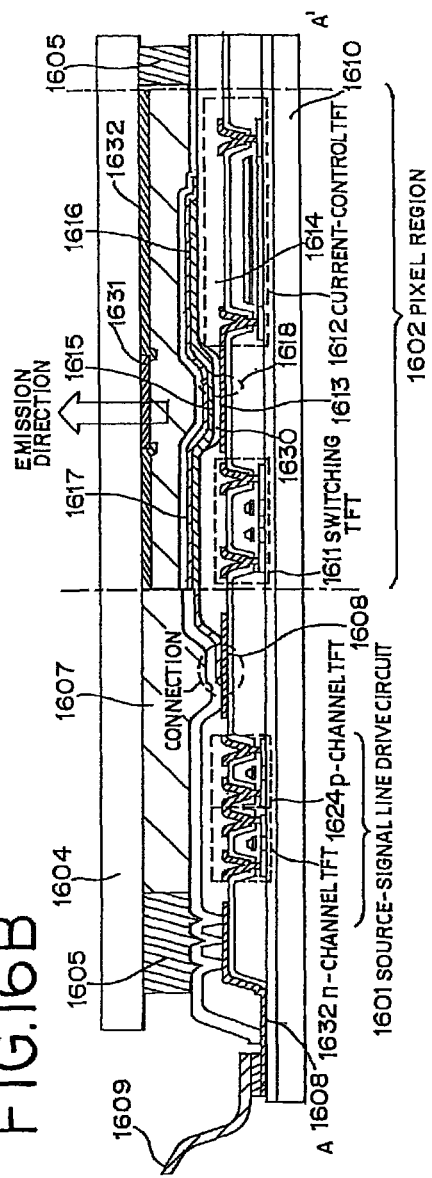
FIG.16A
FIG.16B

DISPLAY DEVICE AND METHOD FOR MANUFACTURING THEREOF

This application is a continuation of copending U.S. application Ser. No. 13/900,798, filed on May 23, 2013, which is a continuation of U.S. application Ser. No. 13/209,717, filed on Aug. 15, 2011 (now U.S. Pat. No. 8,450,925 issued May 28, 2013), which is a continuation of U.S. application Ser. No. 12/790,238, filed on May 28, 2010 (now U.S. Pat. No. 8,004,183 issued Aug. 23, 2011) which is a continuation of U.S. application Ser. No. 11/713,910, filed on Mar. 5, 2007 (now U.S. Pat. No. 7,728,513 issued Jun. 1, 2010) which is a continuation of U.S. application Ser. No. 10/345,745, filed on Jan. 16, 2003 (now U.S. Pat. No. 7,199,516).

BACKGROUND OF THE INVENTION

1. Field of the Invention

The present invention relates to a display device using an organic light-emitting device that has an anode, a cathode, and a film containing an organic compound that emits light by application of electric field (hereinafter referred to as organic thin film). Specifically, the present invention relates to a high reliable display device that drives at a low voltage. The organic thin film contains an organic compound as light-emitting compounds, and also may contain an inorganic compound as another component elements. The term display device in this specification refers to an image display device that employs the organic light-emitting device as a light-emitting device. Also included in the definition of the display device are: a module in which a connector, such as an anisotropic conductive film (FPC: flexible printed circuit), a TAB (tape automated bonding) tape, or a TCP (tape carrier package), is attached to the organic light-emitting device; a module in which a printed wiring board is provided on the tip of a TAB tape or a TCP; and a module in which an IC (integrated circuit) is mounted directly to the organic light-emitting device by the COG (chip on glass) method.

2. Description of the Related Art

The organic light-emitting device emits light when electric field is applied. Light emission mechanism thereof is said to be as follows. A voltage is applied to an organic thin film sandwiched between electrodes to cause recombination of electrons injected from the cathode and holes injected from the anode in the organic thin film and, the excited molecule (hereinafter referred to as molecular exciton) emits light resultingly with releasing energy when returns to base state.

There are two types of molecular excitons from organic compounds; one is singlet exciton and the other is triplet exciton. This specification includes both cases where singlet excitation causes light emission and where triplet excitation causes light emission.

In the organic light-emitting device such as the above, its organic thin film is usually formed to have a thickness of less than 1 µm. In addition, the organic light-emitting device does not need back light that is required in conventional liquid crystal displays since it is a self-light-emitting device in which light is emitted from the organic thin film by itself. Therefore the great advantage of the organic light-emitting device is very thin and light-weight.

When the organic thin film having a thickness of about 100 to 200 nm, for example, recombination takes place within several tens nanoseconds after injecting carriers, based on the mobility of the carriers in the organic thin film. Considering the process from carrier recombination to light emission, the organic light-emitting device is readied for light emission in microseconds. Accordingly, quick response is also one of the advantages of the organic light-emitting device.

Since the organic light-emitting device is of carrier injection type, it can be driven with a direct-current voltage and noise is hardly generated. Regarding a driving voltage, a report says that a sufficient luminance of 100 cd/m$^2$ is obtained at 5.5 V by using a super thin film with a uniform thickness of about 100 nm for the organic thin film, choosing an electrode material capable of lowering a carrier injection barrier against the organic thin film, and further introducing the hetero structure (two-layer structure) (Reference 1: C. W. Tang and S. A. VanSlyke, "Organic electroluminescent diodes", Applied Physics Letters, vol. 51, no. 12, 913-915 (1987)).

It can be said that the organic light-emitting device demonstrated in Reference 1 is characterized by separation of functions of the hole transporting layer and the electron transporting light-emitting layer in which the former layer is assigned to transport holes and the latter layer is assigned to transport electrons and emit light. The idea of separation of functions has been developed to a double hetero structure (three-layer structure) in which a light-emitting layer is sandwiched between a hole transporting layer and an electron transporting (Reference 2: Chihaya ADACHI, Shizuo TOKITO, Tetsuo TSUTSUI, and Shogo SAITO, "Electroluminescence in Organic Films with Three-Layered Structure", Japanese Journal of Applied Physics, vol. 27, No. 2, L269-L271 (1988)).

An advantage of separation of function is an expansion of freedom in molecular design (for example, it makes unnecessary to make the effort to find bipolar materials) since it is unnecessary to give simultaneously various functions (luminescence, carrier transportation, and carrier injection from electrodes) to one kind of organic material. In other words, high luminescent efficiency can be obtained easily by combining materials excellent in luminescent characteristics with materials excellent in carrier transportation ability.

With respect to separation of function, conception of a cathode buffer layer and an anode buffer layer is suggested as an introduction of a function of carrier injection to reduce driving voltage. There is a report that the driving voltage is reduced by enhancing injection of carrier by means of inserting materials that ease energy barrier into an interface between cathode and the organic thin film thereto (Reference 3: Takeo Wakimoto, Yoshinori Fukuda, Kenichi Nagayama, Akira Yokoi, Hitoshi Nakada, and Masami Tsuchida, "Organic EL Cells Using Alkaline Metal Compounds as Electron Injection Materials", IEEE TRANSACTIONS ON ELECTRON DEVICES, VOL. 44, NO. 8, 1245-1248 (1997)). In Reference 3 it is disclosed that Wakimoto et al. succeeded to reduce driving voltage by using $Li_2O$ as a cathode buffer layer.

With respect to a buffer layer, a buffer layer comprising polymer attracts especially attention in recent years (Reference 4: Yoshiharu Sato, Molecular Electronics and Bioelectronics (The Japan Society of Applied Physics), vol. 11, No. 1, 86-99 (2000)). In Reference 4 it is disclosed that using an anode buffer layer comprising polymer promotes the lower voltages, longer lifetime, and higher heat resistance. The anode buffer layer comprising polymer can be formed thick since the conductivity is increased by introducing appropriate accepter. Thus, it can contribute to flatness and is expected that it have an effect on decreasing short circuit.

With those features, including being thinner and lighter, quick response, and direct current low voltage driving, the organic light-emitting device is attracting attention as a next-generation flat panel display device. In addition, with being a self-light-emitting type and a wide viewing angle, the organic light-emitting device has better visibility and is considered as effective especially in using for a display screen of in-car products and portable equipments. Practically, the organic light-emitting device is used for a display screen of area color of in-car audio equipments.

Another feature of the organic light-emitting device is emission of light of various colors. The well varied colors are derived from the diversity of organic compounds of its own. In other words, the various colors are derived from the flexibility, with which materials emitting different colors can be developed by designing a molecule (introduction of a substituent, for example).

From these points, it is safe to say that the most promising application field of organic light-emitting devices is in full color flat panel displays without mentioning mono color and area color displays. Various methods have been devised to display full color while considering the characteristics of organic light-emitting devices. Currently, there are three major methods for manufacturing a full color display device using the organic light-emitting device. One of those major methods is to separately form the organic light-emitting device that emits red light, the organic light-emitting device that emits green light, and the organic light-emitting device that emits blue light using a shadow mask technique. Red, green, and blue are the primary three colors of light, and each of the three types of organic light-emitting devices makes one pixel. This method is hereinafter referred to as an RGB method. Another one of the major methods obtains the primary three colors of light by using a blue organic light-emitting device as a light emission source and converting the blue light into green light and red light through color conversion layers that are formed of organic fluorescent materials. This method is hereinafter referred to as a CCM method. The last one is a method of obtaining the primary three colors of light by transmitting white light from a white organic light-emitting device used as a light emission source through color filters that are used in liquid crystal display devices or the like. This method is hereinafter referred to as a CF method.

In any of these configuration, driving methods such as passive matrix driving (simple matrix type) and active matrix driving (active matrix type) are used for a display device that is formed by arranging the organic light-emitting devices as a matrix of pixels. In addition, in the case that the pixel density is thickened, it is said that the active matrix type provided switches (for example, non-linear elements such as transistors) in each pixel has an advantage over the passive matrix type because it can drive at a low voltage.

Meanwhile, as mentioned previously the buffer layer comprising polymer as demonstrated in Reference 4 promotes lower driving voltage, longer lifetime, and higher heat resistance. A problem has arisen when the organic light-emitting device having a buffer layer (mainly anode buffer layer) comprising these materials is tried to apply by arranging into matrix of each pixel in the display device. The problem is crosstalk.

In most buffer layer comprising polymer, donor or accepter is added to its polymer comprising π conjugated system to give them conductivity. The polymer is usually applied whole surface by spin coating and the like, and that leads to current leakage between polymer and wirings in places.

For example, it is reported that use of polyethylene dioxythiophene/polystyrene sulfonate (hereinafter referred to as "PEDT/PSS") that is conductive polymer added with accepter as an anode buffer layer for forming a passive matrix display device causes crosstalk (Reference 5: A. Elschner, F. Jonas, S. Kirchmeyer, K. Wussow, "High-Resistivity PEDT/PSS for Reduced Crosstalk in Passive Matrix OELs", Asia Display/IDW '01, 1427-1430 (2001)). In Reference 5 it is described that resistivity of PEDT/PCC is made high on purpose to avoid crosstalk.

However, if the resistivity is made high, the buffer layer comprising polymer can not be formed to have a thick film (that is, current does not pass easily through the organic light-emitting device). Therefore, the characterization that avoid short circuit due to flattening of electrode surface by means of making the film thickening is lost. High resistivity leads to high driving voltage spontaneously. Thus, the advantage of low driving voltage is also lost.

SUMMARY OF THE INVENTION

Therefore, it is an object of the present invention to apply a conductive buffer layer using a polymer to a display device formed by arranging organic light-emitting elements as pixels in a matrix form without causing crosstalk. Also, it is a problem to provide, by the above, a display device which is low in drive voltage, excellent in reliability and heat resistance, and less in defects of short circuits or the like.

Furthermore, it is a problem to provide an electric apparatus less in consumption power and long in life by the manufacture using the display device.

The present invention is a display device having a plurality of pixels arranged in a matrix form, comprising: a substrate; a plurality of first electrodes provided on a insulating surface of the substrate and corresponding to the plurality of pixels; an insulating bank surrounding the first electrode and protruding above a surface of the first electrode; an organic conductor film provided on the insulating bank and first electrode; an organic thin film provided on the organic conductor film and containing an organic compound capable of causing electroluminescence; and a second electrode provided on the organic thin film.

Particularly, the organic conductor film is characterized by comprising a high polymer added with an acceptor or donor. Furthermore, considering a flatness, the organic conductor film is preferably a film formed by a wet scheme. The wet scheme is suitably a spin coat process, ink jet process or spray process. Incidentally, the organic conductor film preferably has a conductivity of $10^{-6}$ S/cm or higher and $10^{-2}$ S/cm or lower.

Meanwhile, the insulating bank is characterized by having a taper form gradually smaller toward the above of the substrate. In this case, the taper form preferably has a taper angle of 60 degrees or greater and 80 degrees or smaller. Furthermore, in the case that the insulating bank has a curved surface form having at least one center of a radius of curvature at the substrate side to the edge line of the insulating bank or in the case that the insulating bank has a curved surface form having at least one center of a radius of curvature at the substrate side to the edge line of the insulating bank and at least one center of a radius of curvature at the opposite side of the substrate side to the edge line of the insulating bank, spin application can be especially, suitably carried out.

Furthermore, in the invention, the display device is characterized by further including a data signal line, a scanning signal line and a nonlinear element connected to the data signal line, the scanning signal line and the first electrode. In this case, the nonlinear element is preferably formed by a combination of a mutually connected thin film transistor and capacitor or a combination of a thin film transistor and a parasitic capacitor to the thin film transistor.

Meanwhile, as long as being a display device, the display device satisfactorily has, in any surface, a transparency for a visible portion of light. Accordingly, the invention is characterized in that the substrate and the first electrode have a transparency for a visible portion of light, or otherwise the second electrode has a transparency for a visible portion of light.

As a manufacturing method for the foregoing display device, in the invention, the process for manufacturing a display device having a plurality of pixels arranged in a matrix form, comprising: a patterning step of forming a plurality of first electrodes corresponding to the plurality of pixels, on an insulating surface of a substrate; a step of forming an insulating bank surrounding the first electrode and protruding above a surface of the first electrode; a step of providing an organic conductor film on the insulating bank and first electrode; a step of forming an organic thin film containing an organic compound capable of causing electroluminescence on the organic conductor film; and a step of forming a second electrode on the organic thin film.

In the invention, the step of providing the organic conductor film on the insulating bank and the first electrode is by a wet process. In this case, the wet process is preferably a process to spray-apply, spin-apply or ink-jet-apply a material solution or material dispersion liquid for the organic conductor film.

Furthermore, in the invention, the patterning step is characterized by including a step to form a data signal line, a scanning signal line and a nonlinear element connected to the data signal line, the scanning signal line and the first electrode. In this case, the nonlinear element is preferably formed by a combination of a mutually connected thin film transistor and capacitor or a combination of a thin film transistor and a parasitic capacitor to the thin film transistor.

BRIEF DESCRIPTION OF THE DRAWINGS

FIG. 4 is a view showing a fabrication apparatus for an organic light-emitting device;

FIGS. 6A, B are views showing an embodiment of an active-matrix display device;

FIG. 15 is a view showing a sectional TEM photographic picture; and

FIGS. 16A, B are views showing an embodiment of an active-matrix display device.

DETAILED DESCRIPTION OF THE PREFERRED EMBODIMENTS

Figure 1A:
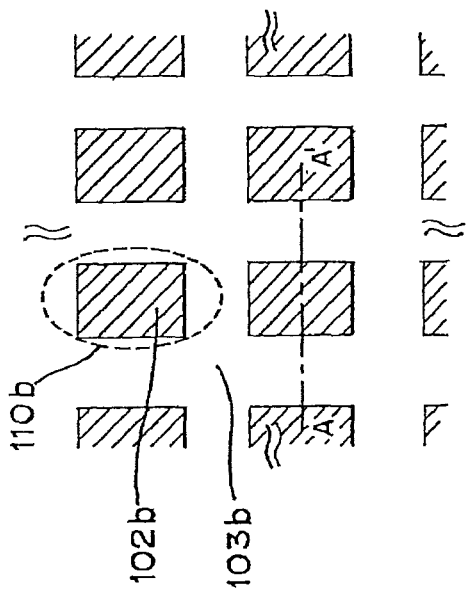
FIG. 1A to 1C are views representing a concept of the present invention.
Figure 1B:
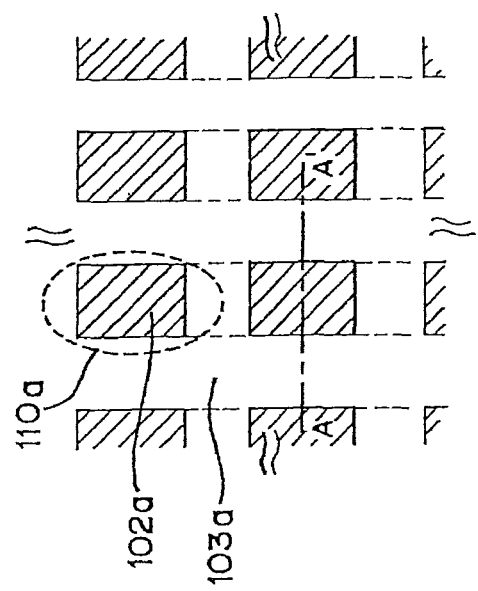
Figure 1C:
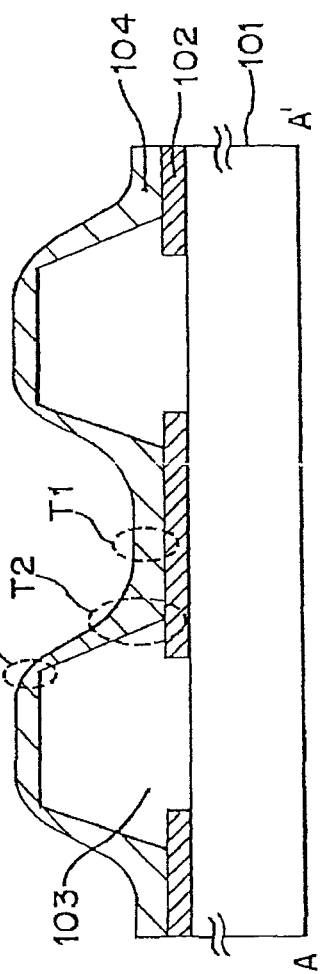

There is shown in FIG. 1 a concept view of the present invention. In FIG. 1A, an insulating bank 103a is provided in a form surrounding the pixel portions 110a in order to form striped (vertically in the figure) first electrodes 102a and pixels 110a, over a substrate. Meanwhile, In FIG. 1B, an insulating bank 103b is provided in a form surrounding the pixels 110b in order to form island-formed first electrodes 102b and pixel portions 110b, on the substrate. In any case, the sectional view taken along line A-A' in the figure is given as in FIG. 1C. 101 is the substrate, 102 is the first electrode, and 103 is the insulating bank.

Various methods are known to form such insulating banks, e.g. disclosed in JP-A-8-227276 (Document 6). Document 6 has a structure having a substrate formed with a plurality of first display electrodes on a surface, an electrical-insulating barrier wall surrounding the first display electrode and protruding above the substrate, a thin film of organic electroluminescent medium having at least one layer formed over the first display electrode in the barrier wall, and a second display electrode commonly formed over a plurality of electroluminescent medium thin films.

It is assumed, in this case, that the entire surface is applied, by a wet scheme(method), with an organic conductive film 104 as represented by a conductive polymer of PEDOT/PSS or the like. In such a case, the organic conductive film 104 has a thickness form of T2>T1>T3 under the influence of the insulating bank 103. Accordingly, the portion T3 has an increased resistance in a lateral direction, making possible to prevent against crosstalk. Furthermore, because the portion T2 is increased in thickness, the electric-field concentration is relaxed at and around the pixel portion. This makes it possible to prevent the organic light-emitting element from deteriorating at around the pixel.

This form is effectively available where applying an organic conductive film by a wet scheme. However, the form can be obtained similarly where forming an organic conductive film by a dry process of vacuum deposition or the like. Hence, dry and wet processes, in any, are effective in forming an organic conductor film 104.

Figure 2A:
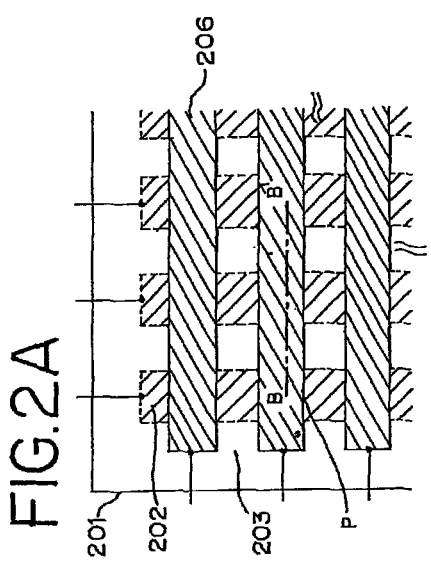
FIG. 2A, B are views showing a concept of a passive-matrix display device of the invention.
Figure 2B:
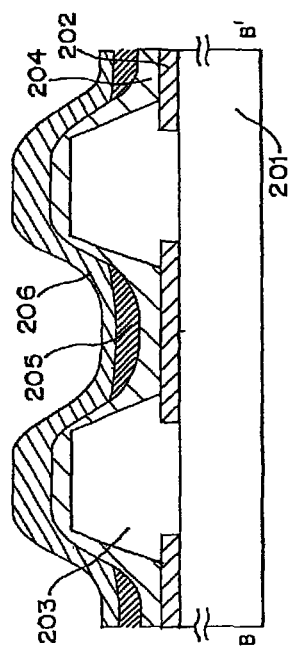

This concept, if applied to a passive-matrix type, provides a form as shown in FIGS. 2A-B. FIG. 2A is a top view while FIG. 2B is a sectional view taken along line B-B' in FIG. 2A. Namely, striped first electrodes 202 are formed over the substrate 201 and an insulating bank 203 is formed in a form protruding above the fist electrodes 202 and surrounding the pixels P. An organic conductive film 204 (representatively, conductive polymer) is provided, further forming an organic thin film 205 containing an organic compound capable of causing electroluminescence. Second electrodes 206 are formed on that, orthogonal to the first electrodes.

It is noted herein that the organic thin film 205 is separately applied on a pixel-by-pixel basis by a metal mask, showing a form suited for full-color display. Naturally, for a single color, solid application is usable instead of separate application.

Figure 3A:
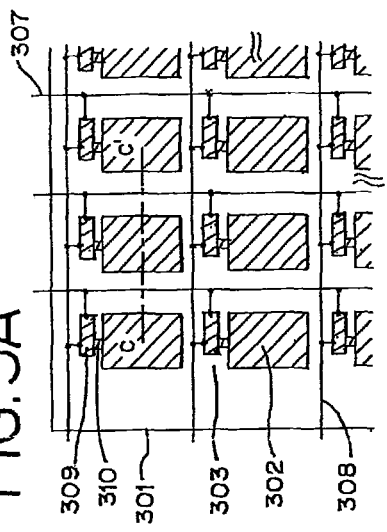
FIGS. 3A, B are views showing a concept of an active-matrix display device of the invention.
Figure 3B:
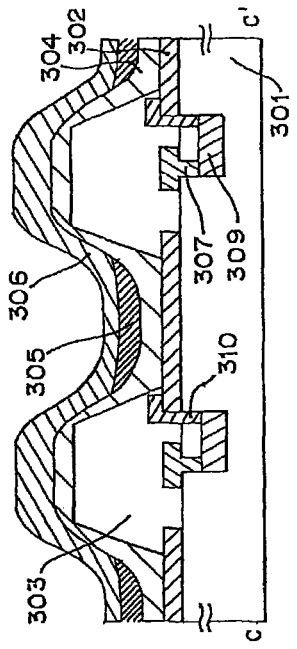

Meanwhile, the concept, if applied to an active-matrix type, provides a form of FIGS. 3A-B. FIG. 3A is a top view while FIG. 3B is a sectional view taken along line C-C' in FIG. 3A. Namely, island-formed first electrodes 302 are formed over the substrate 301 and an insulating bank 303 is formed in a form protruding above the fist electrodes 302 and surrounding the pixels. An organic conductive film 304 is provided on that, further forming an organic thin film 305 containing an organic compound capable of causing electroluminescence. Second electrodes 306 are formed on that by the solid application.

Furthermore, there are provided data signal lines 307, scanning signal lines 308 and non-linear elements 309 connected to the data signal lines 307 and scanning signal lines 308. The non-linear element is connected to the first electrode 302 through a contact 310. This allows to individually switch each pixel. The non-linear element 309, representatively, is formed by a combination of mutually connected thin-film transistor and capacitor or a combination of thin film transistor and parasitic capacitor to the thin-film transistor.

Incidentally, in FIGS. 2 and 3, the organic thin film configuration may use a structure of known organic light-emitting element. Also, the first electrode and the second electrode, in any one, may possess a transparency for a visible portion of light. Where the first electrode is an anode, the second electrode may be a cathode. When the first electrode is a cathode, the second electrode may be an anode.

For the organic conductor film, suitably applied is an approach to provide a dark conductivity by doping an acceptor or donor to an organic semiconductor. Concerning film-forming process, there are included those for deposition by a dry process, e.g. vacuum deposition, and those for film forming by a wet process of spin coating or the like.

The organic conductor film to be formed by a dry process, as one example, is generally by a method to co-deposit a low-molecular organic semiconductor and an acceptor or donor. The organic conductor film, co-deposited by a p-type organic semiconductor and an acceptor, is preferable as a hole injection layer. The organic conductor film, co-deposited by an n-type organic semiconductor and a donor, is preferable as an electron injection layer.

The low-molecular p-type organic semiconductor includes 4,4'-bis[N-(1-naphtyl)-N-phenyl-amino]-biphenyl (abbreviation: α-NPD) and aromatic amine compound, such as 4,4',4"-tris(N, N-diphenyl-amino)-triphenylamine (abbreviation: TDATA) and 4,4',4"-tris[N-(3-methylphenyl)-N-phenyl-amino]-triphenylamine (abbreviation: MTDATA). The low-molecular n-type organic semiconductor includes metal complexes, such as tris(8-quinolinolato)aluminum (abbreviation: $Alq_3$) and bis[2-(2-hydroxyphenyl)-benzooxazolato] zinc (abbreviation: $Zn(BOX)_2$), oxadiazole derivatives, such as 2-(4-biphenyril)-5-(4-tert-butylphenyl)-1,3,4-oxadiazole (abbreviation: PBD) and 1,3-bis[5-(p-tert-buthylphenyl)-1,3, 4-oxadiazole-2-il]benzene (abbreviation: OXD-7), triazole derivatives, such as 5-(4-biphenyril)-3-(4-tert-butylphenyl)-4-phenyl-1,2,4-triazole (abbriviation: TAZ) and 5-(4-biphenyril)-3-(4-tert-butylphenyl)-4-(4-ethylphenyl)-1,2,4-triazole (abbreviation: p-EtTAZ), and a phenanthoroline derivative such as bathophenanthroline (abbreviation: BPhen).bathocuproine (abbreviation: BCP).

The example of those, serving effectively as an acceptor and to be evaporated, includes, representatively, those acting as a Lewis acid, such as TCNQ, TCE, DDQ, benzoquinone, 2,6-naphthoquinone, p-fluoranil, tetrachlorodiphenoquinone and nickelbisdiphenylgluoxim. The example of those, serving effectively as a donor and to be evaporated, includes, representatively, those acting as a Lewis base, such as metals strong in donor nature such as alkali and alkali earth metals besides such organic compounds as TTF, TTT, methylphenothiazine and N-isopropylcarbazole.

The organic conductor film to be deposited by a wet process generally includes, as an example, a method to wet-apply a solution mixing an acceptor or donor in a high polymer having π-conjugated system as represented by a conductive polymer compound. If well film formability, a low-molecular organic compound may be used instead of a high polymer. In also this case, the organic conductive film mixed with an acceptor is preferable as a hole injection layer while the organic conductive film mixed with a donor is preferable as an electron injection layer.

The high polymer having π-conjugated system includes, as examples, polyphenylene derivatives, polythiophene derivatives and poly(paraphenylenevinylene) derivatives besides such materials in practical use as poly(ethylenedioxythiophene) (abbreviation: PEDOT), polyaniline (abbreviation: PAni) and polypyrol.

Those listed in the above can be used as an acceptor or donor. However, by using an acceptor of water-soluble polymer such as polystrene sulfonic acid (PSS), wet application is possible in a water-solvent system. PEDOT/PSS and PAni/PSS are known, which are particularly effective for a hole injection layer.

In the meanwhile, the tapered insulating bank was explained on the example in FIGS. 1 to 3. However, where the insulating bank is in another form, the effect can be obtained similar or greater. FIGS. 14 A-C shows typical views that the tapered insulating bank of FIG. 1C is made in another form.

Figure 14A:
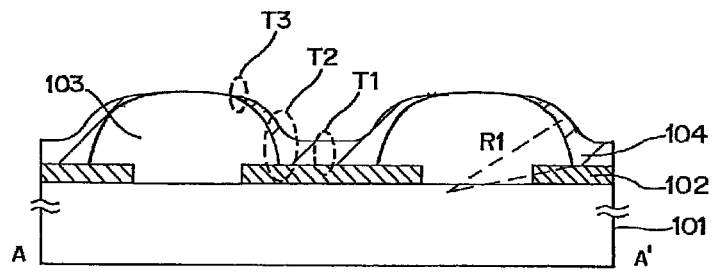
FIGS. 14A, B are views representing a concept of the invention.

FIG. 14A is on a case that the insulating bank 103, at its end, is made in a curved form having one radius of curvature RI at an inward of the insulating bank 103. In such a case, because the insulating bank at its end depicts an arc as shown in FIG. 14A, it is easy to form a state of T2>T1>T3. Particularly, this provides a great effect in preventing against crosstalk, because T3 decreases in thickness as nearing to the top end of the insulating bank.

Figure 14B:
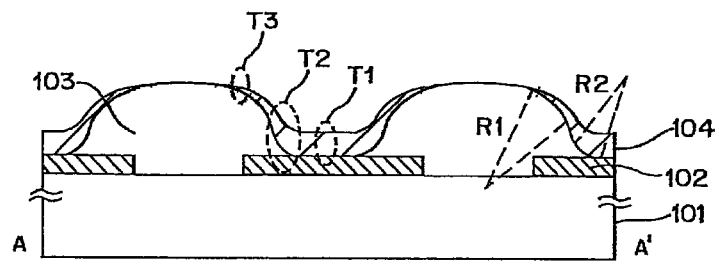

FIG. 14B is on a case that the insulating bank 103, at its end, is made in a curved form having one radius of curvature R1 at an inward of the insulating bank 103 and one radius of curvature R2 at an outward of the insulating bank 103. In such a case, because the insulating bank at its end depicts an S-form as shown in FIG. 14B, it is also easy to form a state of T2>T1>T3. In this case, a great effect is provided in preventing against crosstalk, because T3 decreases in thickness as nearing to the top end of the insulating bank.

The insulating bank form as shown in FIGS. 14A-B are particularly effective in the case wet application is carried out by a spin coat process. This is because liquid is readily spread evenly during spin coating due to moderated end of the insulating bank.

Incidentally, in case hydrogen atoms or molecules are previously existed in the organic conductor film 104, 204 or 304 by a hydrogen plasma or hydrogen ion doping and diffused by heating after forming an organic thin film 205 or 305, in the event of causing unpaired bonds (or radicals) in the organic thin film 205 or 305 during driving-in, they can be repaired to prevent deterioration.

FIG. 4 shows a concept view of an apparatus for forming a display device of FIGS. 2 and 3. The apparatus is based on an example to form an organic thin film by vacuum deposition. This is, mainly, constructed with a transport chamber to transport substrates, a delivery chamber to deliver substrates, a deposition chamber to form various thin films and a seal chamber to carry out sealing. Each chamber has an evacuation device to achieve a required vacuum or a device to produce a gas atmosphere such as $N_2$. The chambers are mutually connected through gate valves or the like. Substrate transport is by a transport robot.

At first, a substrate 401c (hereinafter merely referred to as "substrate", though previously built with a pixel region, drive circuits, interconnections, electrodes, protection films, etc.) is placed into the load chamber 400 from the outside. Typically, TFTs are used in the pixel and drive-circuit regions.

The substrate 401c in the load chamber 400 is transported by a transport robot 401b into the transport chamber 401a and then to a pre-process chamber 402. Typically, the substrate 401c is pre-processed by heating, $O_2$-plasma treatment or the like in the pre-process chamber 402. The pre-process aims at improving the characteristics of an OLED. This also serves to make a substrate application surface hydrophilic and improve its wettability when a water-soluble conductive polymer or the like is to be applied for an organic conductor film.

The substrate completed of pre-process is again returned to the load chamber where it is subjected to nitrogen purge. Then, the substrate is transported to a transport chamber 420 under normal pressure (nitrogen atmosphere), and it is inverted to the normal position within an inversion chamber 422. Then, an organic conductive film (specifically, conductive polymer such as PEDOT/PSS) is applied within an application chamber 421. Although the method of application includes spin coating or dip coating, film-forming herein is by a spray technique. After application, the substrate is transported to an inversion-and-vacuum bake chamber 423 via the transport chamber 420. In this chamber, inversion and vacuum bake are carried out.

In this manner, vacuum bake herein is carried out in an inverted state (i.e. in a face-down state that the substrate surface directed down). However, it is known that the relationship of T2>T1>T3 mentioned in FIGS. 1A-C or 14A-B can be held without a problem when carrying out baking in a face-down state (referred later in Embodiment 8).

After vacuum baking, the substrate is transported to a transport chamber 404 through the transport chamber 401a and delivery chamber 403. In the transport chamber 404, a transport robot, mounted therein, plays a role to transport substrates to each of the chambers connected to the transport chamber 404. The transport chamber 404 is connected with a deposition chamber for the purpose of forming organic layers. Deposition chambers 406R, 406G, 406B are set up to form RGB-colored light-emitting layers, in prospect of fabricating a full-color OLED display device. Furthermore, a deposition chamber 405 is set up in order to form a layer common to the colors, i.e. a carrier transport layer and carrier injection layer. These deposition chambers generally use a vacuum deposition process. In order to obtain full-color light emission, deposition may be carried out by the use of shadow masks for separate application such that the light-emitting layers for emitting RGB light are arranged in a stripe, mosaic or delta form. Incidentally, in the case of applying an organic conductive material onto the entire surface by a spin-coat or dip-coat process, prior to depositing organic layers, an $O_2$-plasma process is carried out combined with a mask in the pre-process chamber 402. This can remove away an unwanted portion of the organic conductor film (region to be applied by a sealing agent or over the interconnections).

The substrate, after completed of organic layer deposition, is transported to a transport chamber 408 via a delivery chamber 407. In the transport chamber 408, a transport robot, mounted therein, plays a role to transport substrates to each of the chambers connected to the transport chamber 408. The transport chamber 408 is connected with a deposition chamber for the purpose of forming a backside electrode or protection film. In the deposition chamber 409, a metal for electrodes (e.g. AlLi alloy or MgAg alloy) is evaporated by a vacuum evaporation process or EB process. In a deposition chamber 411, a transparent conductive film (e.g. ITO or IZO) required for light emission at a top surface of the substrate is deposited generally by a sputter process or chemical vapor deposition (CVD) process. In a deposition chamber 412, a passivation film (e.g. SiN or SiOx film) for surface protection is deposited generally by a sputter process or CVD process.

The substrate completed of film forming is transported to a transport chamber 414 via a delivery chamber 413. The transport chamber 414 is connected with a plurality of chambers required for sealing. In the transport chamber 414, a transport robot mounted therein plays a role to transport substrates or sealed substrates to each chamber connected to the transport chamber 414.

At first, there is a necessity to prepare substrates for sealing. For this purpose, there is provided a sealing glass substrate preparatory chamber 415a and sealing plastic substrate preparatory chamber 418.

In the sealing glass substrate preparatory chamber 415a, a counter glass is placed from the outside to carry out glass-seal on the fabricated OLED. If necessary, a desiccant for preventing the OLED against moisture can be placed on the counter glass. For example, a sheet-formed desiccant may be bonded to a spot-faced part previously formed in the counter glass by a double-sided tape or the like.

On the other hand, in the sealing plastic substrate preparatory chamber 418, preparation is made to plastic-seal the fabricated OLED. The operation may be fully automated, or partly manual by providing globes.

The prepared seal glass or plastic substrate is transported to a dispenser chamber where it is applied by an adhesive (not shown) for later bonding with the substrate. This embodiment uses a UV-set adhesive. If necessary, the desiccant for preventing the OLED against water (not shown) may be reserved within the dispenser chamber 416, instead of during placing a glass in the seal glass substrate preparatory chamber 415a. For example, a sheet-formed desiccant can be bonded on a previously formed spot-faced part of a counter glass by a double-sided tape or the like. This eliminates the necessity to handle a desiccant in the air. The operation may be fully automated, or partly manual by providing globes. Particularly, where the seal plastic substrate has a curvature and elasticity, an adhesive may be applied in a curved state or in a straightly stretched state.

The substrate completed of deposition and the seal glass or plastic substrate applied with an adhesive are transported into a seal chamber 417, where these are bonded together. During bonding, there is a need to apply pressure by the use of a suitable jig (not shown). In the case of a seal plastic substrate having a curvature and elasticity, bonding may be done in a state straightly stretched state. The operation may be fully automated, or partly manual by providing globes.

Then, the substrate and seal substrate bonded together in the seal chamber 417 is transported into a UV-radiation chamber 18 where a UV ray is radiated to cure the adhesive.

The substrate and seal substrate bonded in the UV radiation chamber 418 may be taken out of a delivery chamber 419.

Embodiment 1

Figure 5A:
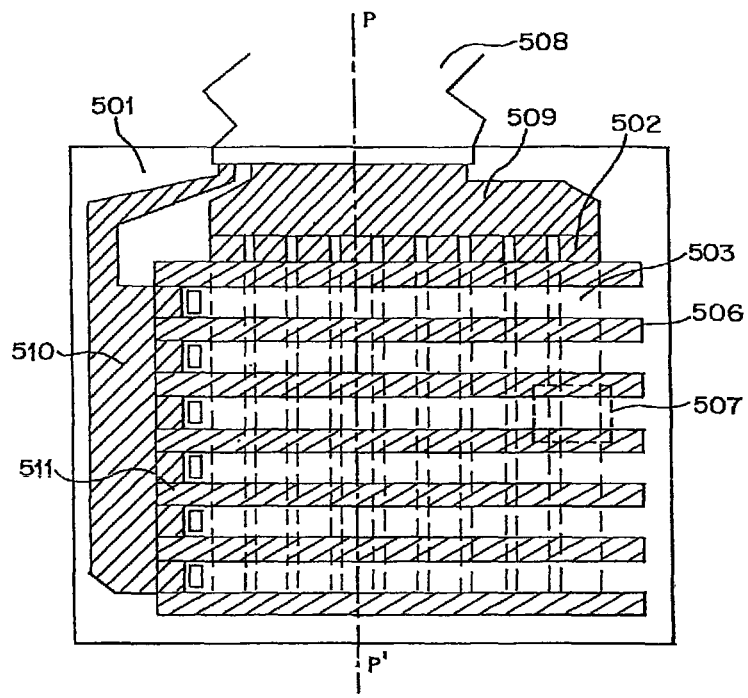
FIGS. 5A, B are views showing an embodiment of a passive-matrix display device.
Figure 5B:
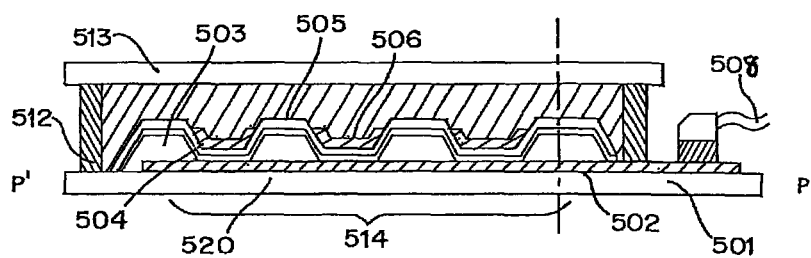

This embodiment exemplifies a passive matrix display device by taking the display device for instance that is disclosed in the present invention. FIG. 5A shows a top view thereof and FIG. 5B shows a sectional view taken along the line P-P' of FIG. 5A.

In FIG. 5A, reference numeral 501 denotes substrate, a plastic material and glass are used for forming the substrate. As the plastic material, polyimides, polyamides, acrylic resins, epoxy resins, PESs (polyethersulfones), PCs (polycarbonates), PETs (polyethylene terephthalates), or PENs (polyethernitriles) can be used in state of a sheet or a film.

Reference numeral 502 denotes scanning lines (anodes) formed from a conductive oxide film. The conductive oxide film used in this embodiment is obtained by indium tin oxide (ITO) that is transparent to the visible light. Denoted by reference numeral 506 are data lines (cathodes) comprising of a metal film. The data lines are formed of stripe patterns by using $CaF_2$ (Al electrode. Reference numeral 503 denotes an insulating bank formed from an acrylic resin. The scanning lines 502 and the data lines 506 are respectively formed of stripe patterns. The two patterns cross each other at right angles. Though not shown in FIG. 5A, conductive polymer (PEDOT/PSS) 504 and organic thin film 505 are sandwiched between the scanning lines 502 and the data lines 506. Intersection units 507 serve as pixels.

The scanning lines 502 and the data lines 506 are connected to external driving circuits through a TAB tape 508. Reference numeral 509 denotes a group of wiring lines that is a mass of the scanning lines 502. 510 denotes a group of wiring lines that is a mass of connection wiring lines 511 connected to the data lines 506. Though not shown, a TCP that is obtained by mounting an IC to a TAB tape may be connected instead of the TAB tape 508.

In FIG. 5B, 512 denotes a seal member, and 513 denotes a cover member bonded to a substrate 501 by the seal member 512. A photo-curable resin can be used for the seal member 512. It is preferred that the sealing member 512 is made of a material that hardly allows degassing and absorbs moisture. The cover member is preferably the same material as the substrate 501, and may be formed from glass (including quartz glass) or plastic. A glass is used here.

The light-emitting device of the present invention configured with above mentioned components can be manufactured by a very simple process since the pixel unit is composed of the scanning lines 502, the data lines 506, the insulating bank 503, the conductive polymer 504, and the organic thin film 505.

A polarizing plate may be provided on a display screen (on which an image is viewed) of the display device demonstrated in this embodiment. The polarizing plate has the effect of minimizing the reflection of light entering the display screen from outside to prevent a viewer from reflecting on the display screen. A circular polarizing plate is used in general. However, it is preferred that the display device has the configuration that hardly causes internal reflection by adjusting the refractive index to prevent the light radiated from the organic thin film from returning to the interior due to reflecting by the polarizing plate.

Embodiment 2

In this embodiment an explanation will be given of a display device comprising the organic light-emitting device disclosed in the present invention. FIG. 6 is a diagram illustrating an active matrix type display device. The FIG. 6A illustrates a view of top surface. FIG. 6B illustrates a cross sectional view of FIG. 6A taken along the line P-P'.

Note that although thin film transistors (referred to as TFTs hereinafter) are used as active devices in this embodiment, MOS transistors may also be used. Additionally, although top gate type TFTs (practically planar type TFTs) will be exemplified as the TFTs, bottom gate type TFTs (typically, inversely staggered TFTs) is alternatively used.

With reference to FIGS. 6A-B, reference numeral 601 denotes a substrate. In order to observe the light through the substrate in the display device, the substrate must be transparent to the visible light. Practically, a glass substrate, a quartz substrate, a crystallized glass substrate or plastic substrate (including a plastic film) may be used. Note that the substrate 601 includes an insulating film provided on the surface thereof.

A pixel unit 621 and a drive circuit 622 are provided on the substrate 601. The pixel unit 621 will first be explained below.

The pixel unit 621 is a region that performs image displaying. A plurality of pixels are formed on the substrate, each pixels is provided with a TFT 611 for control of a current flowing in an organic light-emitting device (referred to hereinafter as current controlling TFT), a pixel electrode (anode) 602, a conductive polymer film 604, an organic thin film 605, and a cathode 606. Each pixel is surrounded with the insulating bank 603. In addition, numeral 612 denotes a TFT for controlling a voltage applied to the gate of the current controlling TFT (referred to as switching TFT hereinafter).

Both n-channel type TFT and p-channel type TFT may be used for the current controlling TFT 611. However, it is preferable to use p-channel TFT here since it is superior in suppressing consumption of electrical power in case the current controlling TFT is connected to the anode of the organic light-emitting device as illustrated in FIGS. 6A-B. Note however that the switching TFT may be either n-channel TFT or p-channel TFT.

It is noted that drain of the current controlling TFT 611 is electrically connected with the pixel electrode 602. In this embodiment the pixel electrode 602 functions as the anode of the organic light-emitting device since a conductive material having a work function within a range of 4.5 to 5.5 eV is used for forming the pixel electrode 602. The pixel electrode 602 may typically be made of materials having transparency to the light such as indium oxide, tin oxide, zinc oxide, or compounds thereof (such as ITO). The conductive polymer 604 and the organic thin film 605 are formed on the pixel electrode 602.

Further, the cathode 606 is formed on the organic thin film 605. It is desirable that a conductive material having a work function ranging from 2.5 to 3.5 eV is used for forming the cathode 606. The cathode 606 is typically made of a conductive film containing alkaline metal elements or alkali rare metal elements, a conductive film containing aluminum, and one that aluminum or silver is laminated on the above conductive films.

A layer comprising the cathode 606 is covered by a protection film 607. The protection film 607 is formed in order to prevent oxygen and water from penetrating into the organic light-emitting device. As materials for forming the protection film 607, silicon nitride, silicon oxynitride, aluminum oxide, tantalum oxide, or carbon (typically diamond like carbon) may be used. Especially in the case that diamond carbon is used for the protection film 607, hydrogen atom is contained in the protection film 607. As mentioned above, diffusion of hydrogen atom into the organic thin film by heating is helpful in preventing degradation of the organic thin film by terminating dangling bond (or radical) that is generated in the organic thin film during driving.

An explanation will next be given of the drive circuit 622. The drive circuit 622 is the region that controls the timing of signals (gate signal and data signal) being sent to the pixel unit 621, which is provided with a shift register, a buffer, a latch, an analog switch (transfer gate), or a level shifter. In FIGS. 6A-B a CMOS circuit is shown which is formed from an n-channel TFT 613 and p-channel TFT 614 for use as a basic unit of these circuits.

The circuit structure of the shift register, the buffer, the latch, the analog switch (transfer gate) or the level shifter may be designed to have a configuration that has become publicly known. Additionally although in FIGS. 6A-B the pixel unit 621 and the drive circuit 622 are provided on the same substrate, it is also possible to electrically connect IC and LSI without providing the drive circuit 622.

Reference numeral 623 denotes a gate signal line drive circuit, and 622 denotes a data signal line drive circuit. A signal is transmitted from the TAB (Tape Automated Bonding) tape 616 to the gate signal line drive circuit 623 and the data signal line drive circuit 622 through an input wiring 615. Though not shown, a TCP (Tape Carrier Package) that is obtained by mounting an IC (Integrated Circuit) to a TAB (Tape Automated Bonding) tape may be connected instead of the TAB tape 616.

Reference numeral 608 denotes a cover member coated on top of the display device by sealing member 609 comprising of resin. For the cover member 608 any material can be used, provided that the materials do not allow oxygen and water to be penetrated. The cover member is comprised of a glass 608a having a depression and drying agent 608b. Thus, the organic light-emitting device is completely sealed into enclosed space 610 by the sealing member 609. The enclosed space 610 may be filled up with inert gas (typically nitride gas or noble gas), resin, or inert liquid (for example liquid fluorocarbon such as perfluoroalkane). In addition, it is effective to put absorbent and deoxidant into the enclosed space 610.

In FIGS. 6A-B it is illustrated that the pixel electrode (anode) 602 is electrically connected to the current control TFT 611. However, the display device can be formed in a configuration in which the cathode is connected to the current control TFT. In that case same material for forming the cathode 606 may be used to the pixel electrode, and the same material for forming the pixel electrode (anode) 602 may be used to the cathode. This case requires that the current control TFT may be n-channel TFT.

A polarizing plate may be provided on a display screen (on which an image is viewed) of the display device demonstrated in this embodiment. The polarizing plate has the effect of minimizing the reflection of light entering the display screen from outside to prevent a viewer from reflecting on the display screen. A circular polarizing plate is used in general. However, it is preferred that the display device has the configuration that hardly causes internal reflection by adjusting the refractive index to prevent the light radiated from the organic thin film from returning to the interior by reflecting by the polarizing plate.

Embodiment 3

Figure 7:
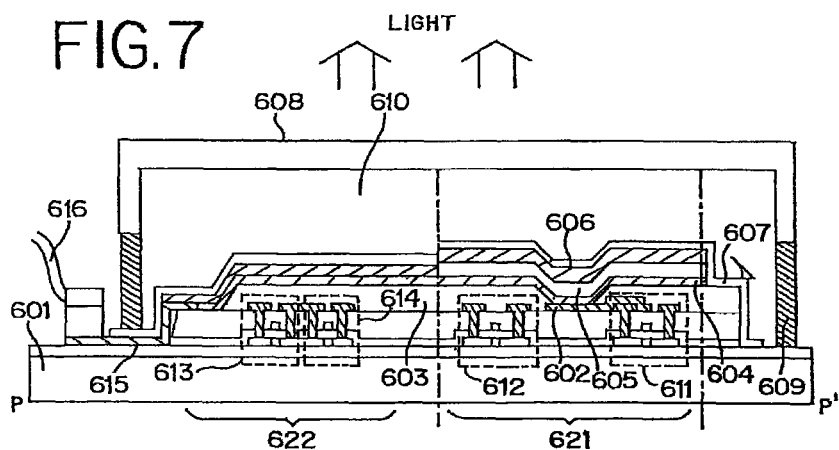
FIG. 7 is a view showing an embodiment of an active-matrix display device.

This embodiment exemplifies an active matrix display device by taking the display device for instance. In this embodiment the display device having a configuration in which light is emitted through the opposite substrate attached active devices (hereinafter referred to as top emission) is demonstrated, which is different from the configuration illustrated in Embodiment 2. FIG. 7 shows a sectional view thereof.

Note that although thin film transistors (referred to as TFTs hereinafter) are used as active devices in this embodiment, MOS transistors may also be used. Additionally, although top gate type TFTs (practically planar type TFTs) will be exemplified as the TFTs, bottom gate type TFTs (typically, inversely staggered TFTs) is alternatively used.

In this embodiment, except a first electrode, a second electrode, a protection film, and cover member may have the same structures as those illustrated in Embodiment 2.

Since the first electrode 602 connected to the current control TFT 611 is used as an anode in this embodiment, a conductive material having a large work function is preferably used for the electrode. Typical examples of the conductive material include metals such as nickel, palladium, tungsten, gold, and silver. In this embodiment, the first electrode 602 is preferably not transparent to the light and, more preferably, is comprised of high reflective materials as well.

Since the top emission structure is exemplified here, it is based on the assumption that the second electrode 606 used in the display device having a transparency to light. Thus, the second electrode 606 is preferably formed to be a super thin film having a thickness of 20 nm when a metal is used to the second electrode 606.

The protection film 607 is formed to protect the organic light-emitting device from oxygen and water. In this embodiment any material can be used for the protect film, provided that it is transparent to light.

Reference numeral 608 denotes a cover member that is bonded by sealing member comprising of resin. For the cover member 609 any material can be used, provided that the materials do not allow oxygen and water to be penetrated and is transparent to light. A glass is used to the cover member in this embodiment. The enclosed space 610 may be filled up with inert gas (typically nitride gas or noble gas), resin, or inert liquid (for example liquid fluorocarbon such as perfluoroalkane). In addition, it is effective to put absorbent and deoxidant into the enclosed space 610.

In FIG. 7 it is illustrate that the first electrode (anode) 602 is electrically connected to the current control TFT 611. However, the display device can be formed in a configuration in which the cathode is connected to the current control TFT. In that case same material for forming the cathode may be used to the first electrode, and the same material for forming the anode may be used to the second electrode. This case requires that the current control TFT may be n-channel TFT.

Embodiment 4

This embodiment shows an example of a display device as is shown in Embodiment 2 or 3 that is driven in accordance with digital time gray scale display.

Figure 8A:
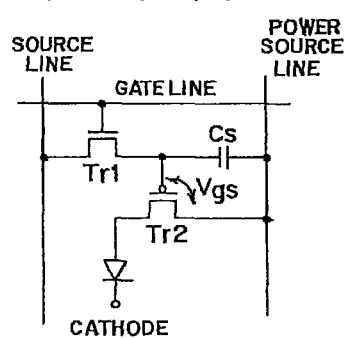
FIGS. 8A to 8C are diagrams showing an embodiment of a drive method.

FIG. 8A shows the circuit structure of a pixel that uses an organic light-emitting device. Tr represents a transistor and Cs represents a storage capacitor. In the circuit structure of FIG. 8A, a source line is connected to source side of transistor Tr1, and a gate line is connected to gate side of transistor Tr1. A power source line is connected to source side of storage capacitor Cs, and transistor Tr2. Since anode of the organic light-emitting device of the present invention is connected to the side of the drain of transistor Tr2, cathode is formed at the opposite side of transistor Tr2 across the organic light-emitting device.

In this circuit, when a gate line is selected, a current flows into Tr1 from a source line and a voltage corresponding to the signal is accumulated in Cs. Then, a current that is controlled by the gate-source voltage ($V_{gs}$) of Tr2 flows into Tr2 and the organic light-emitting device.

After Tr1 is selected, Tr1 is turned OFF to hold the voltage ($V_{gs}$) of Cs. Accordingly, a current continues to flow in an amount dependent of $V_{gs}$.

Figure 8C:
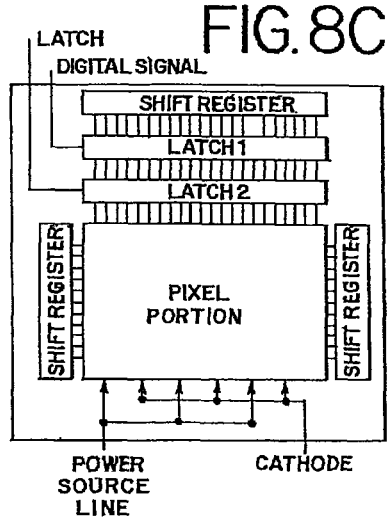
Figure 8B:
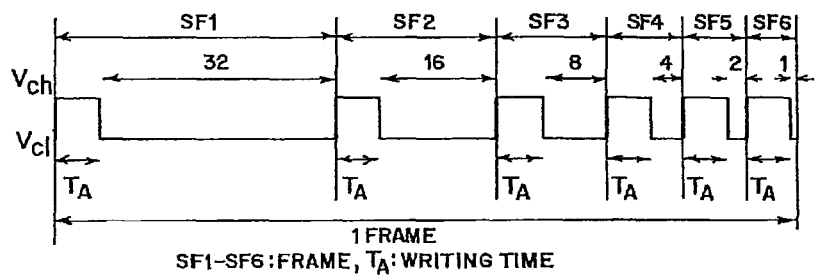

FIG. 8B illustrates a chart for driving this circuit in accordance with digital time gray scale display. In digital time gray scale display, one frame is divided into plural sub-frames. FIG. 8B illustrates 6 bit gray scale in which one frame is divided into six sub-frames. TA represents writing periods. In this case, the ratio of light emission periods of the sub-frames is 32:16:8:4:2:1.

FIG. 8C schematically shows driving circuits of the TFT substrate in this embodiment. In the circuit structure of FIG.

8C, the power supply line and the cathode illustrated in FIG. 8A are connected to the pixel unit in which each pixel is comprised of the organic light-emitting device of the present invention. A shift register is connected to the pixel unit via a latch 1 and a latch 2 in this order. A digital signal is inputted to the latch 1, and a latch pulse is inputted to the latch 2 to transmit a picture data to the pixel unit.

A gate driver and a source driver are provided on the same substrate. In this embodiment, the pixel circuit and the drivers are designed to be digitally driven. Accordingly, fluctuation in TFT characteristics does not affect the device and the device can display uniform images.

Embodiment 5

The display devices of the present invention that have been demonstrated in the embodiments above have advantages of low power consumption and long lifetime. Accordingly, electric appliances that include those display devices as their display portions and the like can operate consuming less power than conventional ones and can be durable. The advantages are very useful especially for electric appliances that use batteries as power sources such as portable equipment, because low power consumption leads directly to conveniences (batteries last a long time).

The display device is self-luminous, whereby the backlight used in liquid crystal displays is not required. The device has an organic thin film whose thickness is less than 1 μm. Therefore the display device can be made thin and light-weight. Electric appliances that include the display device as their display portions are accordingly thinner and lighter than conventional ones. This too leads directly to conveniences (lightness and compactness for carrying) and is very useful particularly for portable equipment and like other electric appliances. Moreover, being thin (unvoluminous) is doubtlessly useful for all of the electric appliances in terms of transportation (mass transportable) and installation (space-saving).

Being self-luminous, the display device is characterized by having clear visibility in bright places and wide viewing angle than liquid crystal display devices. Therefore electric appliances that include the display device as their display portions have advantages of easiness in viewing display.

More specifically, electric appliances that use a display device of the present invention have, in addition to merits of conventional organic light-emitting devices, namely, thinness/lightness and high visibility, new features of low power consumption and long lifetime, and therefore are very useful.

This embodiment exemplified the electric appliances that include as display portions the display device of the present invention. Specific examples thereof are shown in FIGS. 9 and 10. The organic light-emitting device included in the electric appliance of this embodiment can be any of the elements disclosed in the present invention. The light-emitting device included in the electric appliance of this embodiment can have any of the configurations illustrated in FIGS. 2, 3, and 5 to 8.

Figure 9A:
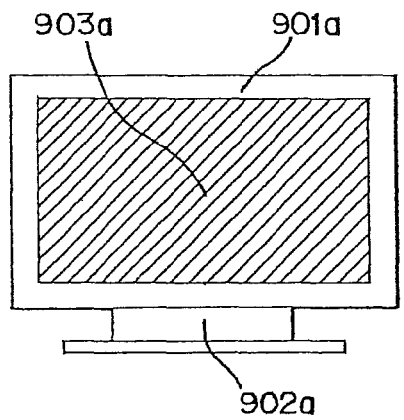
FIGS. 9A to 9F are views showing concrete examples of electric apparatus.

FIG. 9A shows a display using an organic light-emitting device. The display includes a case 901a, a support base 902a, and a display portion 903a. By using the light-emitting device of the present invention as the display portion 903a, the display can be thin and light-weight, as well as inexpensive. Accordingly, transportation is simplified, the desk space occupies as little as possible, and lifetime is long.

Figure 9B:
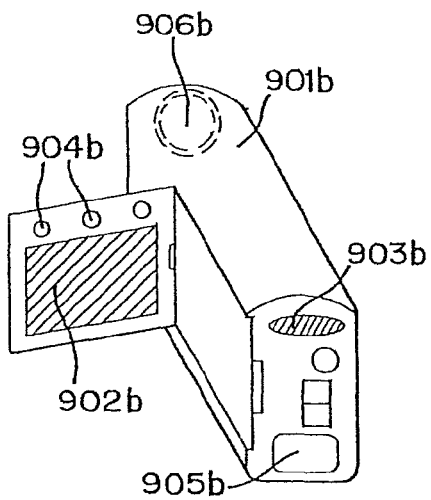

FIG. 9B shows a video camera, which includes a main body 901b, a display portion 902b, a voice input portion 903b, operational switches 904b, a battery 905b, and an image receiving portion 906b. By using the light-emitting device of the present invention as the display portion 902b, the video camera consumes less power and can be light-weight. Therefore, the battery consumption decreases and carrying thereof also becomes easier.

Figure 9C:
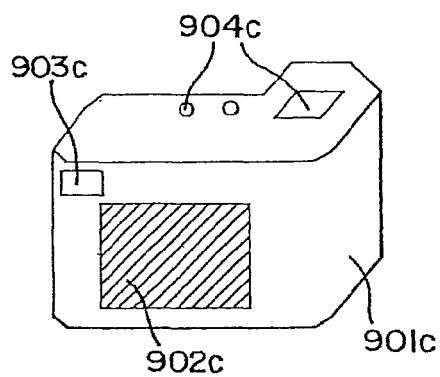

FIG. 9C shows a digital camera, which includes a main body 901c, a display portion 902c, a viewfinder 903c, and operational switches 904c. By using the light-emitting device of the present invention as the display portion 902c, the digital camera consumes less power and can be light-weight. Therefore, the battery consumption decreases and carrying thereof also becomes easier.

Figure 9D:
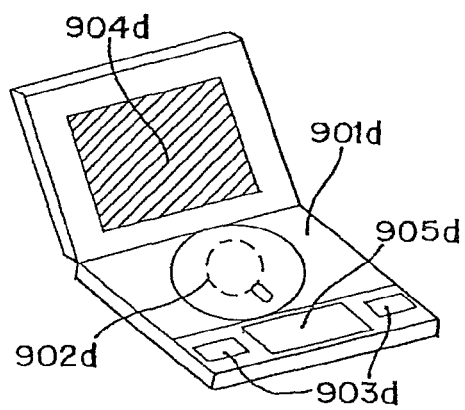

FIG. 9D shows an image reproducing device equipped with a recording medium. The device includes of a main body 901d, a recording medium (such as CD, LD, or DVD) 902d, operational switches 903d, a display portion A 904d, and a display portion B 905d. The display portion A 904d mainly displays image information whereas the display portion B 905d mainly displays text information. By using the light-emitting device of the present invention as the display portion A 904d and the display portion B 905d, the image reproducing device consumes less power and can be light-weight as well as inexpensive. This image reproducing device equipped with a recording medium may be a CD player, a game machine, or the like.

Figure 9E:
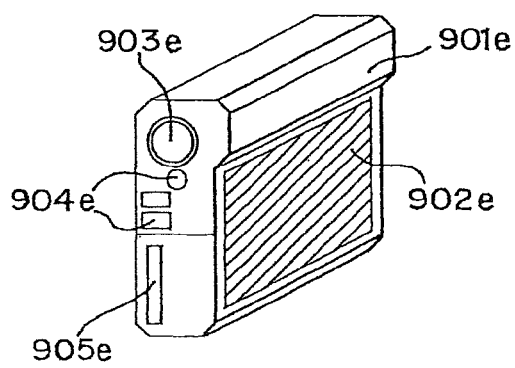

FIG. 9E shows a mobile computer, which includes a main body 901e, a display portion 902e, an image receiving portion 903e, operational switches 904e, and a memory slot 905e. By using the light-emitting device of the present invention as the display portion 902e, the mobile computer consumes less power and can be thin and light weight. Therefore, the battery consumption decreases and carrying thereof also becomes easier. This mobile computer has a recording medium with a flash memory and a non-volatile memory integrated thereon, which can record and playback information.

Figure 9F:
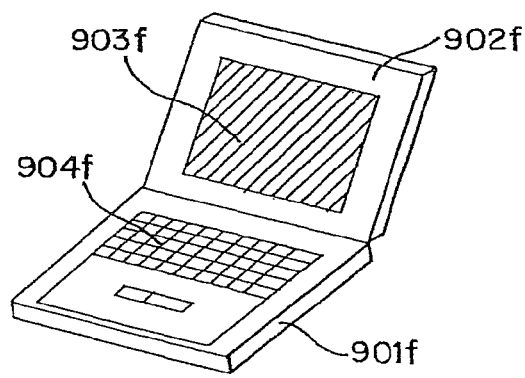

FIG. 9F shows a personal computer, which includes a main body 901f, a frame 902f, a display portion 903f, and a keyboard 904f. By using the light-emitting device of the present invention as the display portion 903f, the personal computer consumes less power and can be thin and light-weight. When it is to be used as a mobile computer, that is, when there is a need to carry it, the low power consumption and the lightness will be of great advantage.

Note that the above electric appliances display information distributed through electronic communication lines such as the Internet or radio communication such as electric wave in many cases, and, in particular, display animated information with increasing frequency. Because organic light-emitting devices have very fast response speed, the above electric appliances are preferable for such animated display.

Figure 10A:
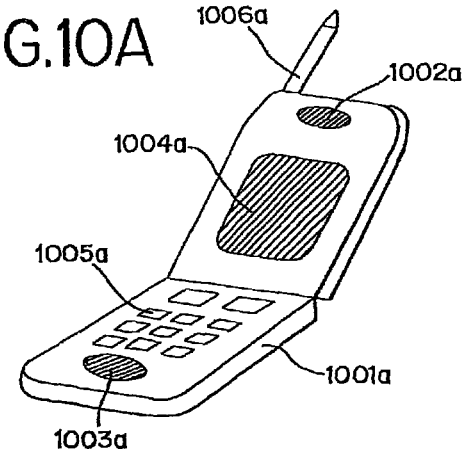
FIGS. 10A, B are views showing concrete examples of electric apparatus.

FIG. 10A shows a mobile phone, which includes a main body 1001a, an audio output portion 1002a, an audio input portion 1003a, a display portion 1004a, operational switches 1005a, and an antenna 1006a. By using the light-emitting device of the present invention as the display portion 1004a, the mobile phone consumes less power and can be thin and light-weight. Therefore, the main body becomes compact, the battery consumption decreases, and carrying thereof also becomes easier.

Figure 10B:
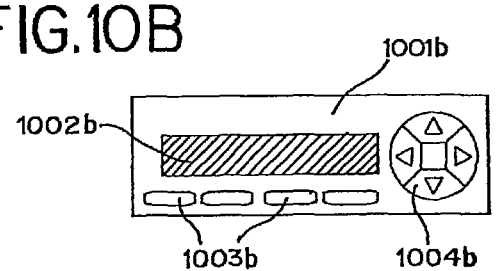

FIG. 10B is an audio playback device, (specifically a car audio system), which includes a main body 1001b, a display portion 1002b, and operational switches 1003b, and 1004b. By using the light-emitting device of the present invention as the display portion 1002b, the audio playback device consumes less power and can be light-weight. Although car audio is taken as an example in this embodiment, it may also be a home audio system.

In the electric appliances as shown in FIGS. 9 to 10, it is effective to give a function for modulating the luminance of emitted light in accordance with brightness of the usage environment by further building-in an optical sensor and thus providing means for detecting brightness of the usage environment. If the user can ensure the brightness of 100 to 150 in contrast ratio in comparison with the brightness of the usage environment, image or text information can be recognized without difficulty. Namely, when the environment is bright, the luminance of an image is raised so that the image can easily be viewed, while when the environment is dark, the luminance of the image is suppressed so as to lower the power consumption.

Embodiment 6

Figure 11:
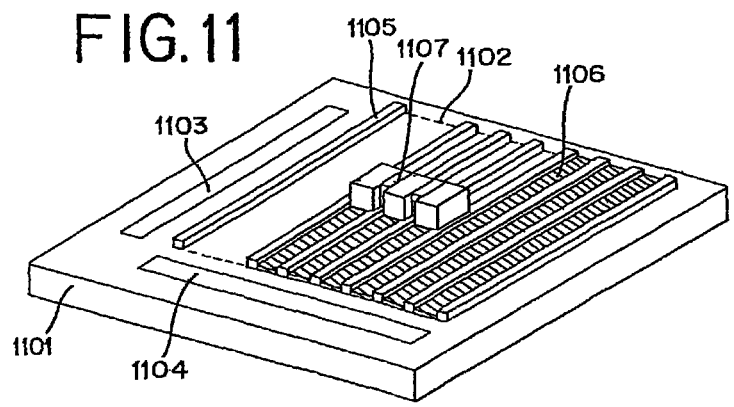
FIG. 11 is a view showing a concept to continuously form a conductive polymer by an ink jet method.

Conductive polymer may be formed in a stripe form by using a dispenser or ink jet scheme instead of applying it to the entire surface by the spin coating process. FIG. 11 shows a manner to form a conductive polymer 1106 to a pixel region 1102 of a substrate formed with a data drive circuit 1104, by an ink jet scheme. The pixel region 1102 has banks 1105 in a stripe form to form the conductive polymer 1106 at between the banks. The banks 1105 are formed so that the adjacent ones of organic compound layers are not mixed with each other during forming organic compound layers by an ink jet scheme.

The conductive polymer 1106 is formed by ejecting a composition material containing conductive polymer through an ink head 1107. The composition material is continuously ejected through the ink head to form a linear pattern.

Figure 12A:
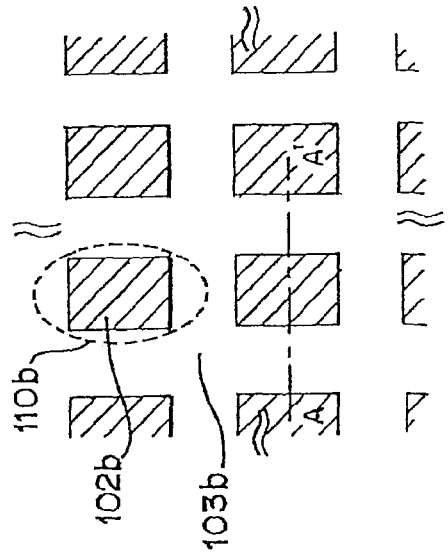
FIGS. 12A to 12C are views showing a concept of the invention having continuously formed a conductive polymer by an ink jet method.
Figure 12B:
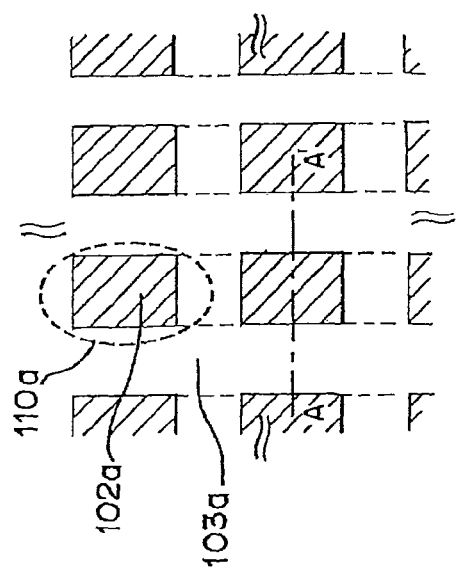
Figure 12C:
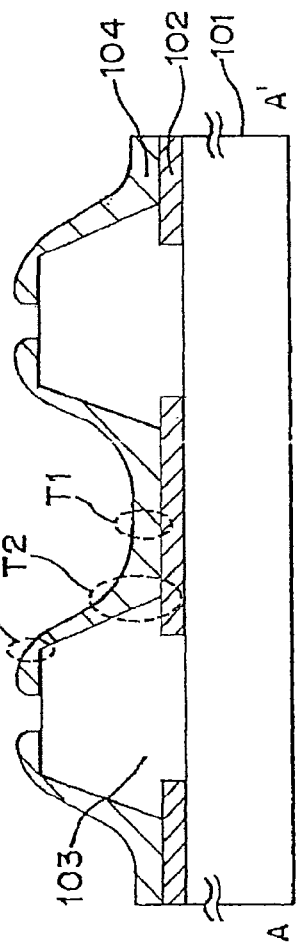

FIG. 12A shows a provision of insulating banks 103a in a form surrounding pixels 110a in order to form first electrodes 102a in a stripe form (vertical in the figure) and pixels 110a on the substrate. FIG. 12B shows a provision of insulating banks 103b in a form surrounding pixels 110b in order to form first electrodes 102b in an island form and pixels 110b on the substrate. In any case, the section taken along line A-A' in the figure is given as in FIG. 12C. Namely, the conductive polymer 104 can be formed between the banks, in a separate form without formation on the banks 103. On the conductive polymer layer, a light-emitting layer or electron injection/transport layer may be formed of a low-molecular compound material.

In such a case, the conductor polymer 104 has a thickness form of T2>T1>T3 under the influence of the insulating bank 103. Accordingly, the portion T3 has an increased lateral resistance to prevent against crosstalk. Furthermore, because the portion T2 has an increased thickness, the concentration of electric field can be relaxed at around the pixels to prevent the organic light-emitting element from deteriorating at around the pixels.

Embodiment 7

This embodiment shows an example to manufacture an active-matrix display device.

At first, on an insulating surface are formed a plurality of TFTs (including switching TFTs and current-control TFTs), holding capacitances, first electrodes (anodes) connected to current-control TFTs and banks covering the ends of the first electrodes. The first electrode may be a material, an alloy or compound material which comprises at least an element selected from Ti, TiN, TiSi$_x$N$_y$, Ni, W, Wsi$_x$, WN$_x$, WSi$_x$N$_y$, NbN, Mo, Cr, Pt, or Ti, Si, Ni, W, Nb, Cr, Zn, Sn, In, Mo. In addition, the first electrode may use a film or a layered film based on these materials in a range of total film thickness of 100 nm to 800 nm. In order to provide preferred coverage, the bank is made with a curved surface having a curvature at its upper or lower end thereof. For example, in the case the material of bank uses a positive photosensitive acryl, it is preferred to provide an insulator 1114 with a curved surface having a radius of curvature (0.2 µm-3 µm) at only an upper end thereof. For the bank, it is possible to use a negative type to be made insoluble in an etchant by photosensitive light or a positive type to be made soluble in an etchant by light.

Then, a hole injection layer is formed on a surface of the first electrode in a region not covered by the bank, by the application scheme. For example, a poly(ethylenedioxythiophene)/polystrene sulfonic acid solution (PEDOT/PSS) acting for a hole injection layer is applied to the entire surface by the spin coat scheme and then baked. After forming a hole injection layer by the application scheme, vacuum heating (at 100-200° C.) is preferably carried out immediately before film-forming due to a deposition process. For example, after washing the surface of the first electrode (anode) by a sponge, a poly(ethylenedioxythiophene)/polystrene sulfonic acid solution (PEDOT/PSS) is applied to the entire surface to a set film thickness of 60 nm by the spin coat scheme. This is pre-baked at 80° C. for 10 minutes and then baked at 200° C. for 1 hour. Furthermore, immediately before deposition, vacuum heating is carried out (heating at 170° C. for 30 minutes, cooling for 30 minutes) to form an organic thin film including a light-emitting layer without contact with the air by a deposition process. Particularly, in the case of using an ITO film as a first electrode material wherein concavo/convex or fine particles exist on the surface, the influence can be reduced by providing the PEDOT/PSS with a thickness of 30 nm or greater, with a result that point defects can be decreased.

Meanwhile, PEDOT/PSS if applied on an ITO film is not satisfactory in wettability. Accordingly, after a PEDOT/PSS solution is applied first by the spin coat process, it is once cleaned with pure water thereby improving wettability. Again, a PEDOT/PSS solution is applied second by the spin coat process and then baked, to preferably form a film with evenness. Incidentally, after the first application, once cleaning with pure water provides an effect to improve the quality of surface and remove fine particles.

In the case of forming a film of PEDOS/PSS by the spin coat process, the resulting film is over the entire surface. It is preferred to selectively remove it in regions of substrate end face and peripheral edge, terminals and connections between cathodes and lower interconnections. Removal is preferably by O$_2$ ashing or the like.

Next, second electrodes (cathodes) are formed on the organic thin film. The second electrode may use a material having a small work function (Al, Ag, Li or Ca, or their alloy MgAg, MgIn, AlLi, CaF$_2$ or CaN). The second electrode is preferably evaporated by a resistance-heating process causing less damage to the TFTs.

Figure 13A:
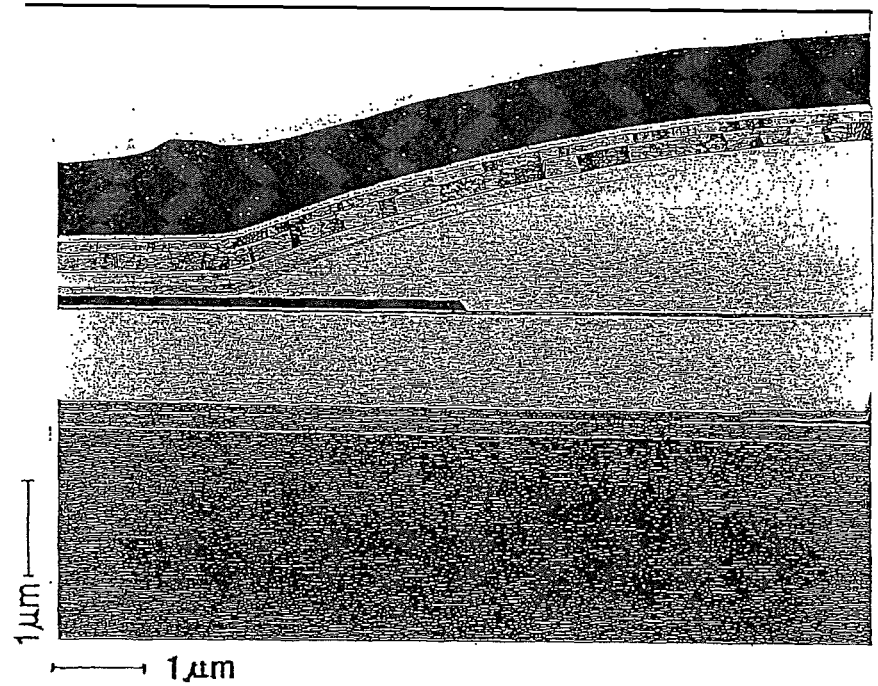
FIGS. 13A, B are figures showing a sectional TEM photographic picture.
Figure 13B:
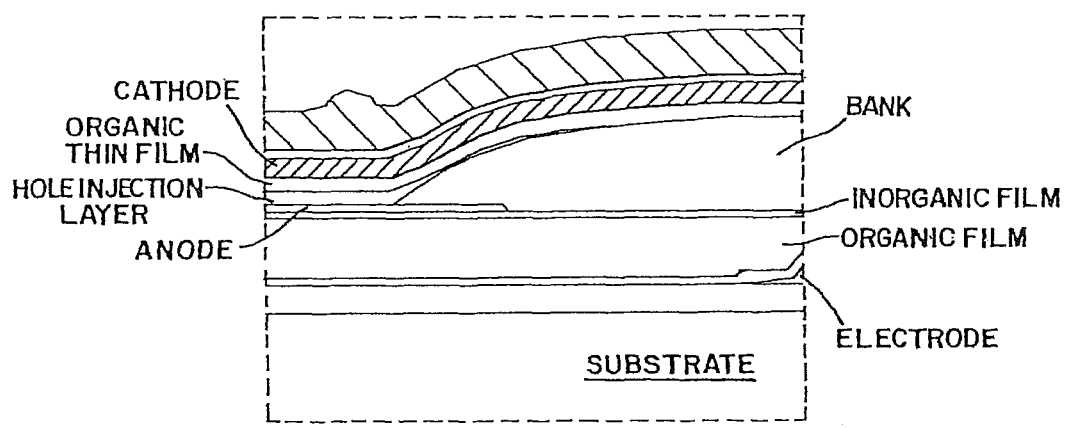

FIG. 13A is a TEM photographic picture as observed by cutting a device of after forming the second electrodes. FIG. 13B is a typical view corresponding to FIG. 13A. In FIG. 13A, PEDOT/PSS is formed approximately 90 nm on the first electrode.

This embodiment forms a curved surface having curvature at the upper or lower end of the bank. This provides a characteristic that, even by a spin coat process, the film thickness of the bank moderate sidewall is made smaller as distant from the first electrode, preferably the structure is made that a conductive polymer as a hole injection layer is absent on the upper part of the bank.

As shown in FIG. 13A, PEDOT/PSS as a hole injection layer is not confirmed on the upper part of the bank despite it is present in a small thickness on the bank moderate sidewall. By providing the structure of FIG. 13A, crosstalk can be effectively suppressed from occurring.

This embodiment can be freely combined with any one of the embodiment or Embodiments 1 to 6.

Embodiment 8

In the case that an organic light-emitting device of the invention is fabricated by using an apparatus as shown in FIG. 4, during baking after applying an organic conductive material of conductive polymer or the like, baking is in a state the application surface is positioned down, i.e. face down. In this embodiment, experiment was conducted to confirm that a form as in Embodiment 7 is to be obtained by such a bake process.

First, PEDOT/PSS was applied to a substrate having an insulating bank having the same form as that of the structure of FIG. 13, by the spin coat technique. Thereafter, bake was conducted at 200° C. with the application surface directed down. The form was observed by sectional TEM, the situation of which is shown in FIG. 15. 1501 is an ITO and 1502 is a PEDOT/PSS layer. The layer 1503 somewhat white is a protection layer (carbon layer).

As shown in FIG. 15, it was confirmed that the form quite similar to FIG. 13 can be obtained even when baking an organic conductive film after wet-application in a position of face down. Accordingly, the form as a feature of the invention can be formed regardless of a substrate position during baking.

Embodiment 9

This embodiment shows an example of a light-emitting device in a top emission structure. FIG. 16 shows a schematic view of the same.

FIG. 16A is a top view showing a light-emitting device. FIG. 16B is a sectional view taken on the line A-A' in FIG. 16A. Reference numeral 1601 shown at the dotted line is a source-signal line drive circuit, reference numeral 1602 is a pixel region and reference numeral 1603 is a gate-signal line drive circuit. Reference numeral 1604 is a transparent seal substrate and reference numeral 1605 is a first seal material. A transparent second seal material 1607 is filled at the inside surrounded by the first seal material 1605. The first seal material 1605 contains a gap material to sustain a gap between the substrates.

Reference numeral 1608 is an interconnection to convey a signal to be inputted to the source-signal line drive circuit 1601 and gate-signal line drive circuit 1603. This receives a video or clock signal from an FPC (flexible print circuit) 1609 serving as an external input terminal. Note that, although only the FPC is shown herein, the FPC may be attached with a printed wiring board (PWB).

Next, explanation is made on a sectional structure by using FIG. 16B. Although drive circuits and pixel region are formed on a substrate 1610, a source-signal line drive circuit 1601 as a drive circuit and a pixel 1602 are shown herein.

The source-signal line drive circuit 1601 is formed by a CMOS circuit combined with an n-channel TFT 1623 and a p-channel TFT 1624. The TFTs forming the drive circuit may be formed by a known CMOS circuit, PMOS circuit or NMOS circuit. Although this embodiment shows a driver-integrated type forming drive circuits on the substrate, such configuration is not necessarily required, i.e. drive circuits can be externally formed instead of on the substrate.

The pixel region 1602 is formed with a plurality of pixels including a switching TFT 1611, a current-control TFT 1612, and a first electrode (anode) 1613 electrically connected to a drain of the same. The current-control TFT 1612 may be an n-channel TFT or p-channel TFT. However, this is preferably a p-channel TFT where connected to the anode. Meanwhile, it is preferred to properly provide a holding capacitance (not shown). It is noted that shown herein is an example on a sectional structure of one of the pixels arranged in a countless number wherein two TFTs are used on that one pixel. However, three or more TFTs may be properly used.

Because the first electrode 1613 herein is structurally, directly connected to a drain of the TFT, the layer under the first electrode 1613 is preferably formed of silicon material capable of having ohmic contact to the drain while the uppermost layer in contact with the layer containing an organic compound is of a material having a great work function. For example, in case providing a three-layer structure with a titanium nitride film, an aluminum-based film and a titanium nitride film, the interconnection has a low resistance to have a favorable ohmic contact and serve as an anode. Meanwhile, the first electrode 1613 may be made as a single layer of a titanium nitride film, a chromium film, a tungsten film, a Zn film or a Pt film, or may use three or more layers.

Insulating banks (also called banks or barrier walls) 1614 are formed at the both ends of the first electrode (anode) 1613. The insulating banks 1614 may be formed of an insulator containing organic resin or silicon. Herein, as the insulating bank 1614, an insulating bank in the form of FIG. 16 is formed by using a positive photosensitive acrylic resin.

In order to make coverage preferable and application of organic conductive material 930 even, a curved surface having curvature is formed at the upper or lower end of the insulating bank 1614. For example, in the case of using a positive photosensitive acryl as a material for the insulating bank 1614, it is preferred to provide a curved surface with radius of curvature (0.2 μm-3 μm) only at the upper end of the insulating bank 1614. The insulating bank 1614 can use a negative type to be made insoluble in an etchant by photosensitive light or a positive type to be made soluble in an etchant by light.

Meanwhile, the insulating bank 1614 may be covered by a protection film of an aluminum nitride film, an aluminum nitride oxide film, a carbon-based thin film or a silicon nitride film.

Herein, an organic conductor film 1630 is formed on the first electrode (anode) and insulating bank 1614. Although this embodiment shows an example to apply conductive polymer by a spin coat process, another wet scheme may be used. Otherwise, it may be formed by a dry scheme to co-evaporate an organic material and acceptor or donor. It is noted that, in the case of carrying out spin-coat by using a water-solvent based one, such as PEDOT/PSS as conductive polymer, effectively applied is a method that hydrophilic treatment, such as UV ozone treatment or $O_2$ plasma treatment, is previously made on an application surface and thereafter spin coat is carried out.

In this embodiment, because the organic conductor film 1630 is formed by the spin coat process, it has been applied over the entire substrate surface immediately after the application. Accordingly, it is preferred to selectively remove it in regions of substrate end face and peripheral edge, terminals and connections between the second electrode 1616 and the interconnection 1608. Removal is preferably by $O_2$ ashing or laser ablation.

On the organic conductor film 1630, an organic thin film 1615 is selectively formed by a deposition process using a deposition mask or an ink jet scheme. Incidentally, the organic thin film 1615 in this embodiment is assumably a film to exhibit white light emission.

Furthermore, a second electrode (cathode) 1616 is formed on the organic thin film 1615. The cathode may use a material having small work function (Al, Ag, Li or Ca, or their alloy MgAg, MgIn, AlLi, $CaF_2$ or CaN). Herein, in order to transmit emission light, the second electrode (cathode) 1616 uses layers of a metal thin film reduced in film thickness and a transparent conductive film (ITO (alloy of indium oxide and tin oxide), alloy of indium oxide and zinc oxide ($In_2O_3$—ZnO), zinc oxide (ZnO) or the like). In this manner, an organic light-emitting element 1618 is formed with the first electrode (anode) 1613, the organic conductor film 1630, the organic thin film 1615 and the second electrode (cathode) 1616. Because the organic light-emitting element 1618 is made as an example to emit white light, full coloration is possible by providing a color filter having a coloring layer 1631 and shade layer (BM) 1632 (overcoat layer is not shown herein for simplification).

Meanwhile, in case selectively forming the layers respectively containing organic compounds to obtain R, G and B light emissions, fill-color display is available without using a color filter.

A transparent protection layer 1617 is formed to seal the organic light-emitting element 1618. The transparent protection layer 1617 preferably uses an insulation film based on silicon nitride or silicon oxide nitride to be obtained by a sputter process (DC or RC scheme) or PCVD process, a thin film based on carbon (diamond-like carbon: DLC film, carbon nitride: CN film or the like) or a combined layers thereof. In case a silicon target is used for formation in an atmosphere containing nitrogen and argon, it is possible to obtain a silicon nitride film having a high block effect against water content or impurities such as alkali metal. Otherwise, a silicon nitride target may be employed. The transparent protection layer may be formed by using a deposition apparatus using a remote plasma. In order to allow emission light to pass through the transparent protection layer, the film thickness of transparent protection layer is preferably made to a possible small extent.

In order to seal the organic light-emitting element 1618, the seal substrate 1604 is bonded in an inert gas atmosphere by the use of a first seal material 1605 and second seal material 1607. The first seal material 1605 and second seal material 1607 preferably uses epoxy resin. The first seal material 1605 and second seal material 1607 is desirably of a material to pass possible less water content or oxygen.

This embodiment can use, as a material of the seal substrate 1604, plastic of FRP (fiberglass-reinforced plastics), PVF (polyvinyl-fluoride), Mylar, polyester or acryl, besides glass or quartz. Meanwhile, after bonding the seal substrate 1604 by using the first seal material 1605 and second seal material 1607, sealing can be made further with a third seal material in a manner covering a side surface (exposed surface).

As in the above, by sealing the organic light-emitting element in the first seal material 1605 and second seal material 1607, the organic light-emitting element can be completely shielded from the outside. This makes it possible to prevent the intrusion from the external of the substance that accelerates deterioration of the organic compound layer, such as water content or oxygen. Thus, a reliable light-emitting device can be obtained.

Incidentally, in case the first electrode 1613 uses a transparent conductive film, it is possible to manufacture a light-emitting device of two-sided emission type.

By carrying out the invention described in the above, a conductive buffer layer using polymer can be applied to a display device having organic light-emitting elements matrix-arranged as pixels without causing crosstalk. Due to this, a display device can be provided which is low in drive voltage, excellent in reliability and heat resistance, and less in defects of short circuits or the like.

What is claimed is:

1. A light-emitting device comprising:
   a substrate;
   a first electrode and a second electrode each over the substrate, wherein the first electrode and the second electrode are arranged parallel to each other;
   an insulating bank over the first electrode and the second electrode, wherein the insulating bank comprises a first opening overlapping the first electrode and a second opening overlapping the second electrode;
   a first organic thin film over the first electrode, the second electrode, and the insulating bank, wherein the first organic thin film is in contact with the first electrode in the first opening and in contact with the second electrode in the second opening;
   a second organic thin film over the first electrode with the first organic thin film interposed therebetween;
   a third organic thin film over the second electrode with the first organic thin film interposed therebetween; and
   a third electrode over the second organic thin film, the third organic thin film, and the insulating bank,
   wherein the first organic thin film comprises:
      a first region overlapping the first electrode in the first opening;
      a second region overlapping the insulating bank and not overlapping the first electrode; and
      a third region between the first region and the second region, and
   wherein a thickness of the third region of the first organic thin film is larger than a thickness of the first region of the first organic thin film and a thickness of the second region of the first organic thin film.

2. The light-emitting device according to claim 1, wherein the first organic thin film is an organic conductive film.

3. The light-emitting device according to claim 1, wherein the first organic thin film comprises a conductive polymer.

4. The light-emitting device according to claim 1, wherein the thickness of the first region of the first organic thin film is larger than the thickness of the second region of the first organic thin film.

5. The light-emitting device according to claim 1,
   wherein the third region of the first organic thin film comprises a boundary between a first interface and a second interface,
   wherein the first interface is an interface between the first electrode and the first organic thin film, and
   wherein the second interface is an interface between the first organic thin film and the insulating bank.

6. The light-emitting device according to claim 1, wherein the third electrode is arranged perpendicular to the first electrode and the second electrode.

7. The light-emitting device according to claim 6, comprising a fourth electrode over the second organic thin film, the third organic thin film, and the insulating bank, wherein the third electrode and the fourth electrode are arranged parallel to each other.

8. The light-emitting device according to claim 1, wherein the second organic thin film and the third organic thin film are each capable of exhibiting white light emission.

9. A display device comprising the light-emitting device according to claim 1, wherein the light-emitting device comprises a coloring layer over the third electrode.

10. A light-emitting device comprising:
- a substrate;
- a first electrode and a second electrode each over the substrate, wherein the first electrode and the second electrode are arranged parallel to each other;
- an insulating bank over the first electrode and the second electrode, wherein the insulating bank comprises a first opening overlapping the first electrode and a second opening overlapping the second electrode;
- a first organic thin film over the first electrode, the second electrode, and the insulating bank, wherein the first organic thin film is in contact with the first electrode in the first opening and in contact with the second electrode in the second opening;
- a second organic thin film over the first electrode with the first organic thin film interposed therebetween;
- a third organic thin film over the second electrode with the first organic thin film interposed therebetween; and
- a third electrode over the second organic thin film, the third organic thin film, and the insulating bank, wherein the first organic thin film comprises:
- a first region overlapping the first electrode in the first opening;
- a second region overlapping the insulating bank and not overlapping the first electrode; and
- a third region between the first region and the second region, wherein a thickness of the third region of the first organic thin film is larger than a thickness of the first region of the first organic thin film and a thickness of the second region of the first organic thin film, and wherein the insulating bank comprises a curved surface.

11. The light-emitting device according to claim 10, wherein the first organic thin film is an organic conductive film.

12. The light-emitting device according to claim 10, wherein the first organic thin film comprises a conductive polymer.

13. The light-emitting device according to claim 10, wherein the thickness of the first region of the first organic thin film is larger than the thickness of the second region of the first organic thin film.

14. The light-emitting device according to claim 10,
wherein the third region of the first organic thin film comprises a boundary between a first interface and a second interface,
wherein the first interface is an interface between the first electrode and the first organic thin film, and
wherein the second interface is an interface between the first organic thin film and the insulating bank.

15. The light-emitting device according to claim 10, wherein the third electrode is arranged perpendicular to the first electrode and the second electrode.

16. The light-emitting device according to claim 15, comprising a fourth electrode over the second organic thin film, the third organic thin film, and the insulating bank, wherein the third electrode and the fourth electrode are arranged parallel to each other.

17. The light-emitting device according to claim 10, wherein the second organic thin film and the third organic thin film are each capable of exhibiting white light emission.

18. A display device comprising the light-emitting device according to claim 10, wherein the light-emitting device comprises a coloring layer over the third electrode.

* * * * *